(12) United States Patent
Hyde et al.

(10) Patent No.: US 9,442,854 B2
(45) Date of Patent: Sep. 13, 2016

(54) MEMORY CIRCUITRY INCLUDING COMPUTATIONAL CIRCUITRY FOR PERFORMING SUPPLEMENTAL FUNCTIONS

(71) Applicant: Elwha LLC, a limited liability corporation of the state of Delaware, Bellevue, WA (US)

(72) Inventors: Roderick A. Hyde, Redmond, WA (US); Nicholas F. Pasch, Bellevue, WA (US); Clarence T. Tegreene, Mercer Island, WA (US)

(73) Assignee: Elwha LLC, Bellevue, WA (US)

( * ) Notice: Subject to any disclaimer, the term of this patent is extended or adjusted under 35 U.S.C. 154(b) by 512 days.

(21) Appl. No.: 13/841,042

(22) Filed: Mar. 15, 2013

(65) Prior Publication Data

US 2014/0208041 A1 Jul. 24, 2014

Related U.S. Application Data

(63) Continuation-in-part of application No. 13/738,788, filed on Jan. 10, 2013, which is a continuation-in-part of application No. 13/738,747, filed on Jan. 10, 2013, now Pat. No. 8,925,098, which is a
(Continued)

(51) Int. Cl.
*G06F 3/00* (2006.01)
*G11C 7/10* (2006.01)
*G06F 12/08* (2016.01)
*G06F 13/16* (2006.01)

(52) U.S. Cl.
CPC ........... *G06F 12/0831* (2013.01); *G06F 13/16* (2013.01); *G11C 7/1006* (2013.01)

(58) Field of Classification Search
None
See application file for complete search history.

(56) References Cited

U.S. PATENT DOCUMENTS

| | | | |
|---|---|---|---|
| 5,303,163 A | 4/1994 | Ebaugh et al. |
| 5,533,123 A | 7/1996 | Force et al. |
| 6,215,326 B1 | 4/2001 | Jefferson et al. |
| 6,366,117 B1 | 4/2002 | Pang et al. |
| 6,708,273 B1 | 3/2004 | Ober et al. |
| 7,100,071 B2 | 8/2006 | Olarig |
| 7,133,498 B2 | 11/2006 | Cacioppo et al. |
| 7,177,199 B2 | 2/2007 | Chen et al. |
| 7,195,776 B2 | 3/2007 | Helmus |

(Continued)

OTHER PUBLICATIONS

Chi et al.; "Processing-in-Memory in ReRAM-based Main Memory"; SEAL-lab Technical Report; bearing a date of Nov. 30, 2015; pp. 1-11; No. 2015-001.
(Continued)

Primary Examiner — Idriss N Alrobaye
Assistant Examiner — Richard B Franklin

(57) ABSTRACT

A computer system includes but is not limited to a primary processing circuitry, a bus coupled to the primary processing circuitry, and memory circuitry coupled to the bus. The memory circuitry is physically separated from the primary processing circuitry. The memory circuitry includes at least one integrated memory circuit and computational circuitry. The at least one integrated memory circuit configured to store and retrieve data and to provide to the bus, during accessing intervals, requested data for the primary processing circuitry. The computational circuitry co-located with the at least one integrated memory circuit, the computational circuitry co-located with integrated memory circuit can be configured for performing supplemental functions at least partially during time periods that are not accessing intervals.

22 Claims, 20 Drawing Sheets

Related U.S. Application Data continuation-in-part of application No. 13/725,788, filed on Dec. 21, 2012, now Pat. No. 9,323,499, which is a continuation-in-part of application No. 13/691,448, filed on Nov. 30, 2012, which is a continuation-in-part of application No. 13/687,983, filed on Nov. 28, 2012, now Pat. No. 8,996,951, which is a continuation-in-part of application No. 13/678,439, filed on Nov. 15, 2012, now Pat. No. 8,966,310, which is a continuation-in-part of application No. 13/678,430, filed on Nov. 15, 2012, now Pat. No. 9,026,719.

(56) References Cited

U.S. PATENT DOCUMENTS

| | | |
|---|---|---|
| 7,203,842 B2 | 4/2007 | Kean |
| 7,890,691 B2 | 2/2011 | Jiang |
| 7,996,642 B1 | 8/2011 | Smith |
| 8,015,357 B2 | 9/2011 | Strumper et al. |
| 8,131,915 B1 | 3/2012 | Yang |
| 8,171,204 B2 | 5/2012 | Chow et al. |
| 8,572,311 B1 | 10/2013 | Shalvi et al. |
| 8,880,980 B1 | 11/2014 | Mathew et al. |
| 8,893,267 B1 | 11/2014 | Sathe et al. |
| 8,935,493 B1 | 1/2015 | Dolan et al. |
| 2002/0114201 A1 | 8/2002 | Aikawa et al. |
| 2003/0071734 A1 | 4/2003 | Vodin |
| 2003/0072190 A1 | 4/2003 | Miki et al. |
| 2004/0015674 A1 | 1/2004 | Lakhani et al. |
| 2004/0039845 A1 | 2/2004 | Feldmeier et al. |
| 2004/0236954 A1 | 11/2004 | Vogt et al. |
| 2006/0219776 A1 | 10/2006 | Finn |
| 2006/0259848 A1 | 11/2006 | Blevins |
| 2007/0045425 A1 | 3/2007 | Yoshida et al. |
| 2007/0100219 A1 | 5/2007 | Sweitzer et al. |
| 2007/0121575 A1 | 5/2007 | Savry et al. |
| 2007/0129812 A1 | 6/2007 | Ferchau |
| 2007/0136534 A1 | 6/2007 | Mesard et al. |
| 2007/0191728 A1 | 8/2007 | Shennib |
| 2007/0234323 A1 | 10/2007 | Franaszek et al. |
| 2007/0255184 A1 | 11/2007 | Shennib |
| 2007/0294494 A1 | 12/2007 | Conti et al. |
| 2008/0082766 A1 | 4/2008 | Okin et al. |
| 2008/0144349 A1 | 6/2008 | Kato et al. |
| 2008/0193133 A1 | 8/2008 | Krug et al. |
| 2008/0263117 A1 | 10/2008 | Rose et al. |
| 2009/0049111 A1 | 2/2009 | Chari et al. |
| 2009/0089492 A1 | 4/2009 | Yoon et al. |
| 2009/0103379 A1 | 4/2009 | Zhang et al. |
| 2009/0165086 A1 | 6/2009 | Trichina et al. |
| 2009/0234916 A1 | 9/2009 | Cosentino et al. |
| 2009/0289323 A1 | 11/2009 | Tessitore |
| 2009/0292871 A1 | 11/2009 | Watanabe et al. |
| 2009/0300238 A1 | 12/2009 | Panabaker et al. |
| 2010/0027788 A1 | 2/2010 | Tkacik et al. |
| 2010/0049751 A1 | 2/2010 | Giampaolo et al. |
| 2010/0064111 A1 | 3/2010 | Kunimatsu et al. |
| 2010/0070549 A1 | 3/2010 | Nagaraj |
| 2010/0115330 A1 | 5/2010 | Khatri et al. |
| 2010/0148232 A1 | 6/2010 | Ng et al. |
| 2010/0262773 A1 | 10/2010 | Borchers et al. |
| 2010/0293317 A1 | 11/2010 | Confalonieri et al. |
| 2011/0022932 A1 | 1/2011 | Radke |
| 2011/0069539 A1 | 3/2011 | Eleftheriou et al. |
| 2011/0093670 A1 | 4/2011 | Cherian |
| 2011/0093675 A1 | 4/2011 | Lu et al. |
| 2011/0172498 A1 | 7/2011 | Olsen et al. |
| 2011/0224665 A1 | 9/2011 | Crosby et al. |
| 2012/0079318 A1 | 3/2012 | Colgrove et al. |
| 2012/0096215 A1 | 4/2012 | Zhang et al. |
| 2012/0147937 A1 | 6/2012 | Goss et al. |
| 2012/0172085 A1 | 7/2012 | Vuppu et al. |
| 2012/0179735 A1 | 7/2012 | Ferguson et al. |
| 2012/0198152 A1 | 8/2012 | Terry et al. |
| 2012/0224425 A1 | 9/2012 | Fai et al. |
| 2012/0233231 A1 | 9/2012 | Vasyltsov et al. |
| 2012/0233232 A1 | 9/2012 | Vergnes et al. |
| 2012/0260023 A1 | 10/2012 | Nagai et al. |
| 2012/0265923 A1 | 10/2012 | Kuo et al. |
| 2012/0278584 A1 | 11/2012 | Nagami et al. |
| 2012/0311237 A1* | 12/2012 | Park .............. G06F 12/0246 711/103 |
| 2013/0007374 A1 | 1/2013 | Cain, III et al. |
| 2013/0013864 A1 | 1/2013 | Chung et al. |
| 2013/0290792 A1 | 10/2013 | Torla et al. |
| 2013/0304979 A1 | 11/2013 | Zimmer et al. |
| 2013/0332705 A1 | 12/2013 | Martinez et al. |
| 2014/0006898 A1 | 1/2014 | Sharon et al. |
| 2014/0040338 A1 | 2/2014 | Van Der Sluis et al. |
| 2014/0040532 A1 | 2/2014 | Watanabe et al. |
| 2014/0104966 A1 | 4/2014 | Oh et al. |
| 2014/0136583 A1 | 5/2014 | Hyde et al. |
| 2014/0143593 A1 | 5/2014 | Strauss et al. |

OTHER PUBLICATIONS

Hamdioui et al.; "Memristor Based Computation-in-Memory Architecture for Data-Intensive Applications"; Design, Automation & Test in Europe Conference & Exhibition: Mar. 9-13, 2015 (DATE 2015, France); European Design and Automation Association (EDAA); bearing a date of 2015 (created on Jul. 6, 2016); pp. 1718-1721.

* cited by examiner

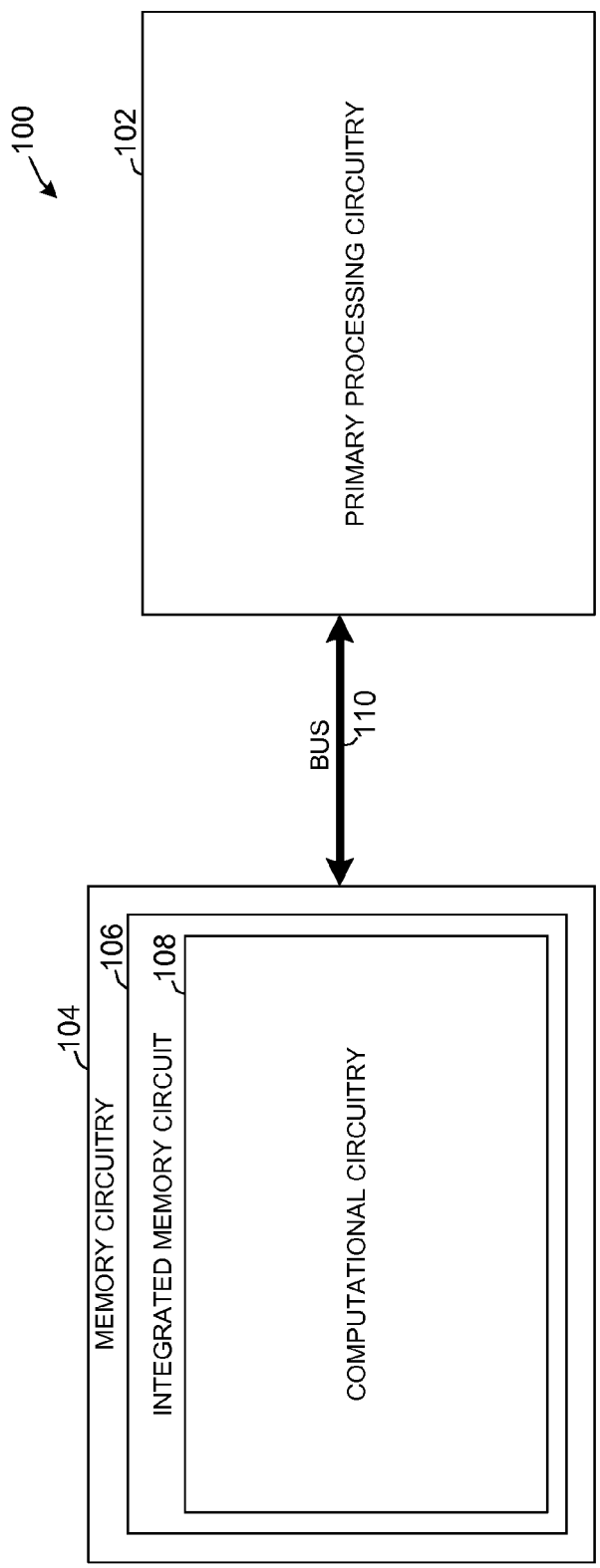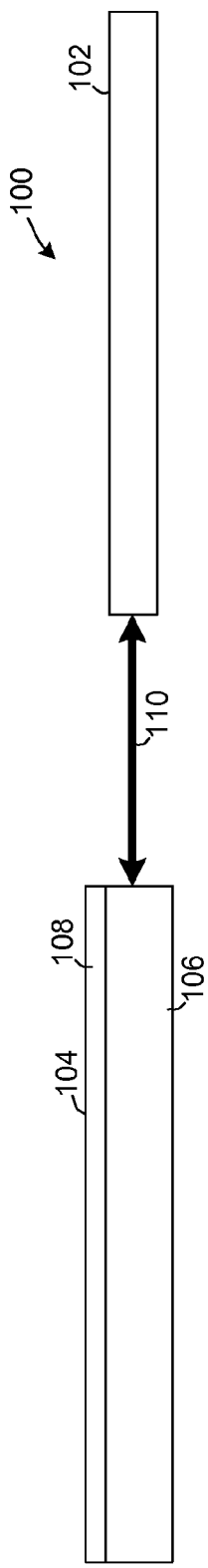

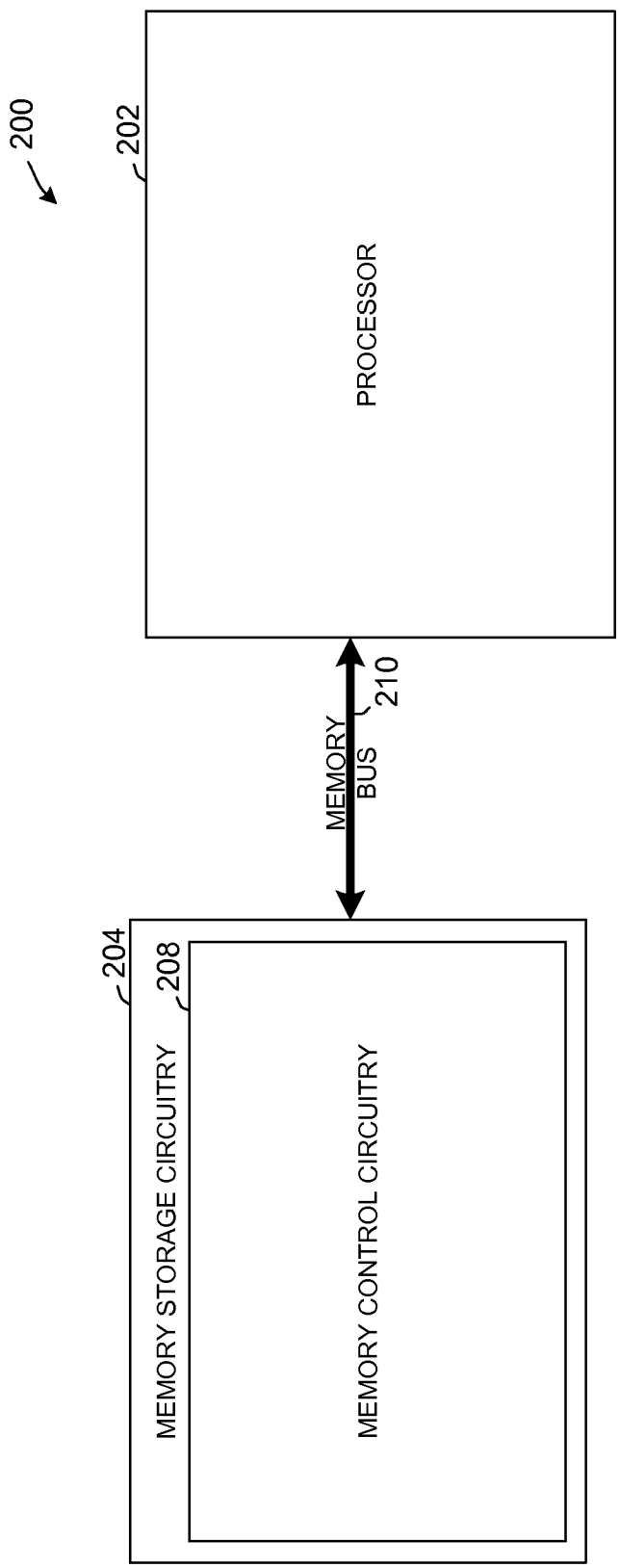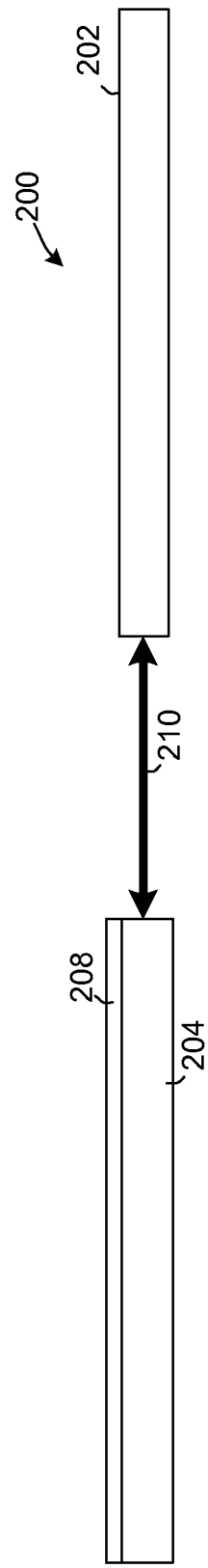
FIG. 2A
FIG. 2B

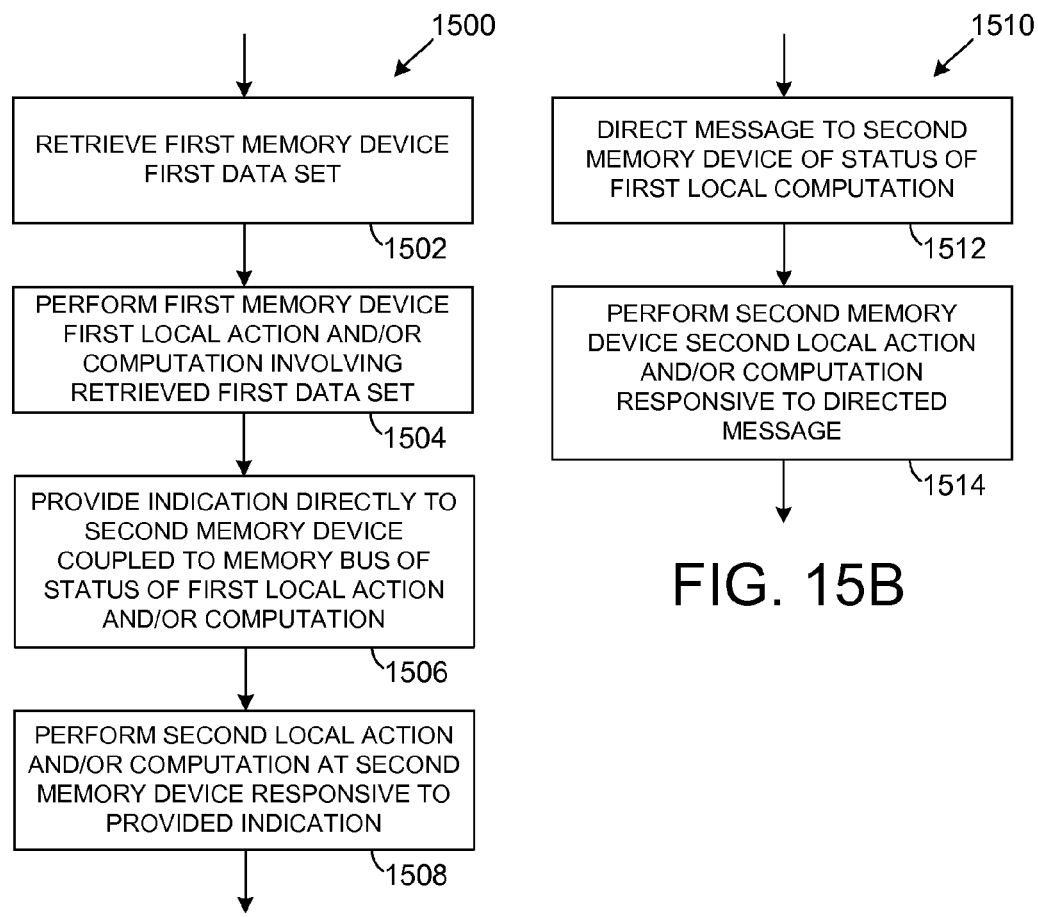

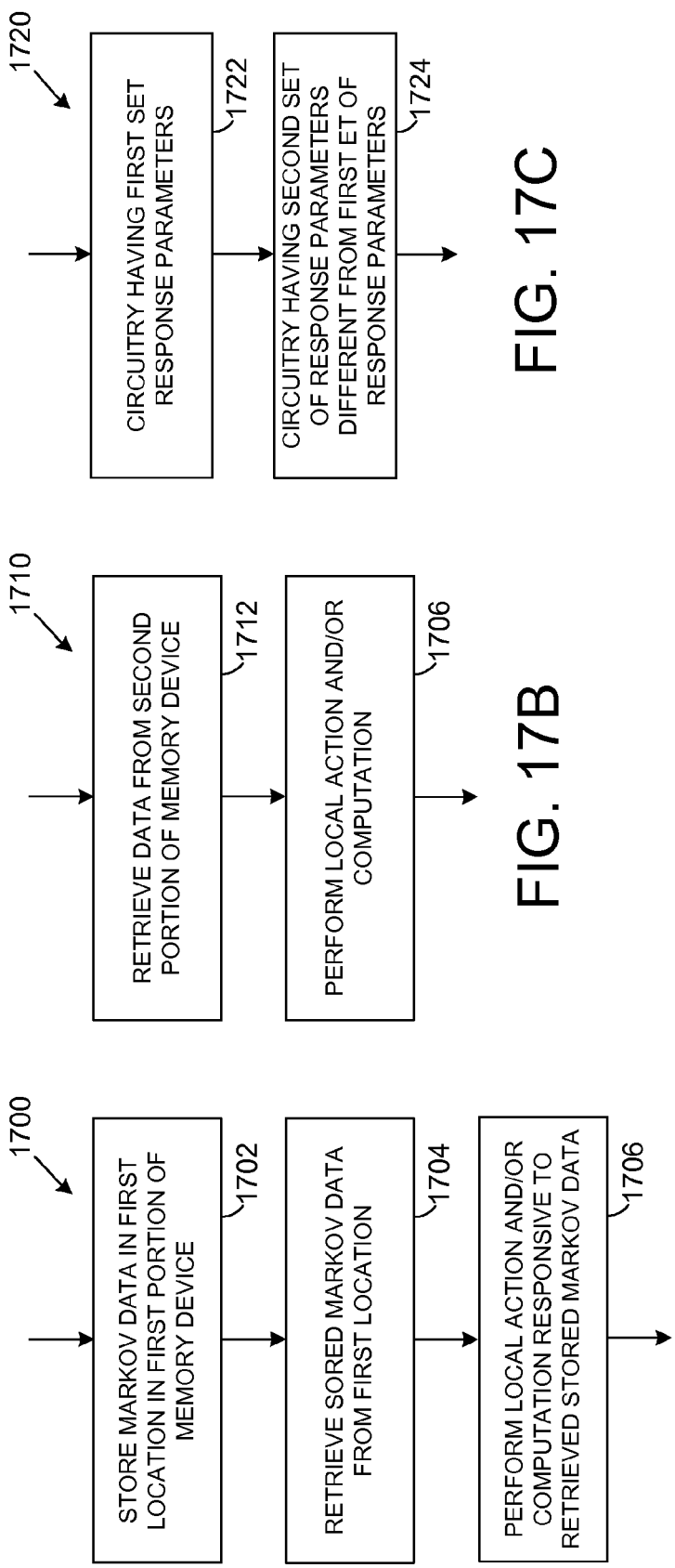

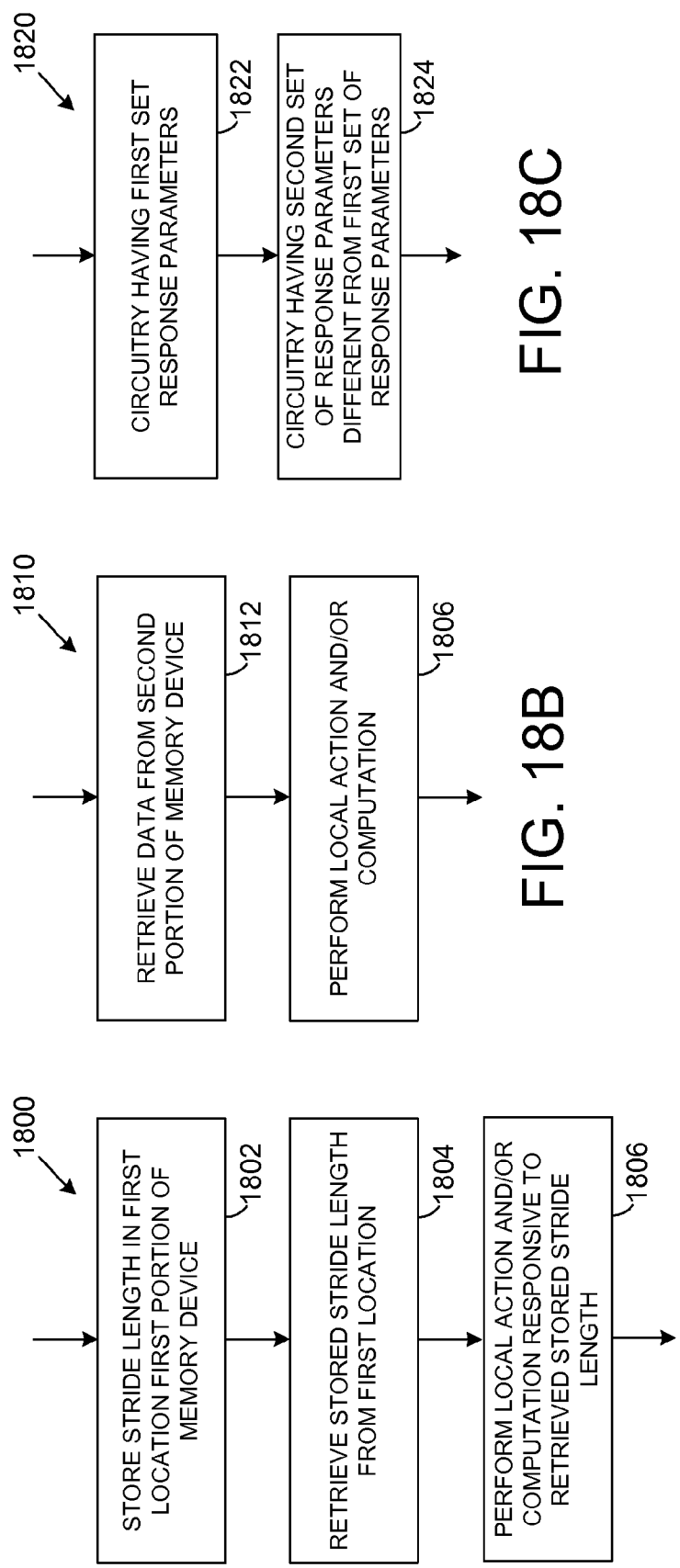

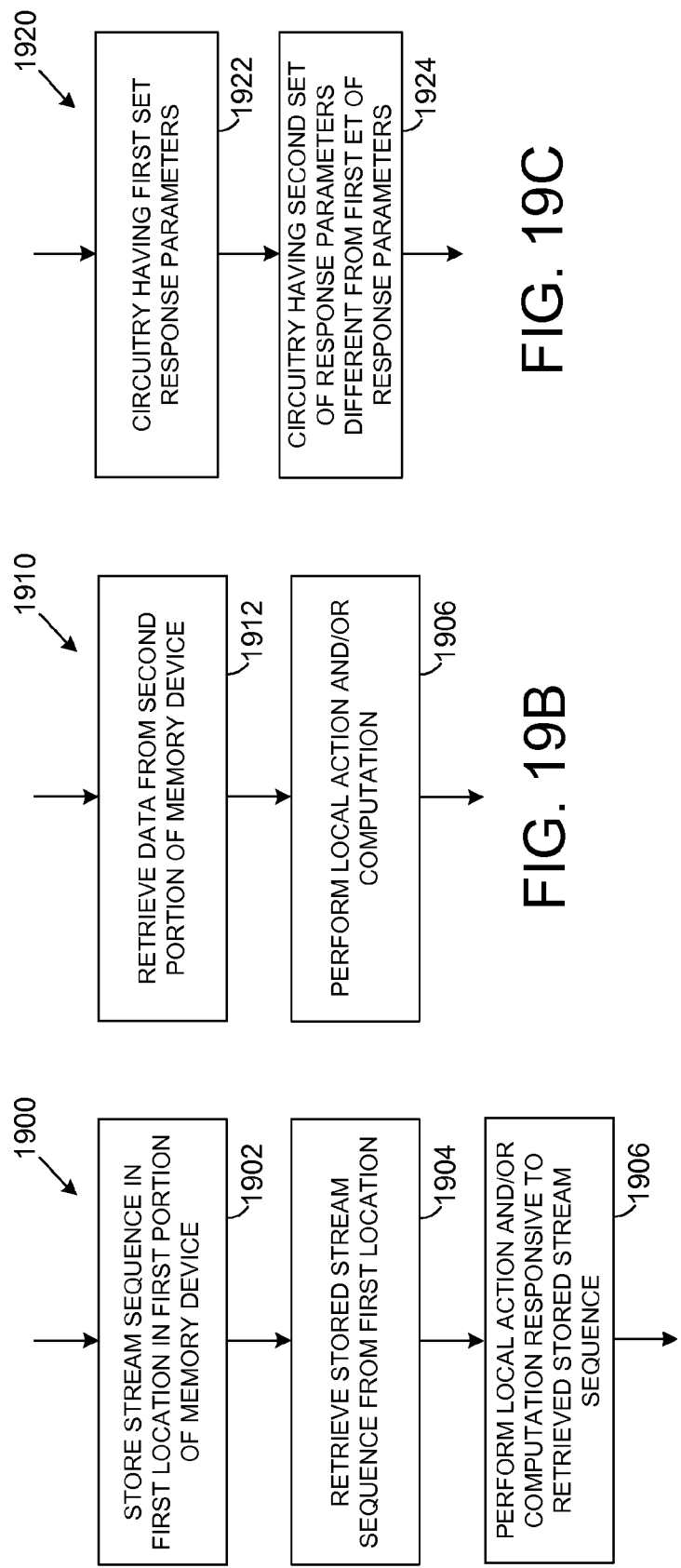

MEMORY CIRCUITRY INCLUDING COMPUTATIONAL CIRCUITRY FOR PERFORMING SUPPLEMENTAL FUNCTIONS

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

For purposes of the USPTO extra-statutory requirements, the present application constitutes a continuation-in-part of U.S. patent application Ser. No. 13/678,430 entitled Intelligent Monitoring for Computation in Memory, naming Roderick Hyde, Nicholas Pasch, and Clarence T. Tegreene as inventors, filed 15 Nov. 2012, which is currently co-pending or is an application of which a currently co-pending application is entitled to the benefit of the filing date;

For purposes of the USPTO extra-statutory requirements, the present application constitutes a continuation-in-part of U.S. patent application Ser. No. 13/678,439 entitled Redundancy for Loss-Tolerant Data in Non-Volatile Memory, naming Roderick Hyde, Nicholas Pasch, and Clarence T. Tegreene as inventors, filed 15 Nov. 2012, which is currently co-pending or is an application of which a currently co-pending application is entitled to the benefit of the filing date;

For purposes of the USPTO extra-statutory requirements, the present application constitutes a continuation-in-part of U.S. patent application Ser. No. 13/687,983 entitled Error Correction with Non-Volatile Memory on an Integrated Circuit, naming Roderick Hyde, Nicholas Pasch, and Clarence T. Tegreene as inventors, filed 28 Nov. 2012, which is currently co-pending or is an application of which a currently co-pending application is entitled to the benefit of the filing date; and For purposes of the USPTO extra-statutory requirements, the present application constitutes a continuation-in-part of U.S. patent application Ser. No. 13/691,448 entitled Flexible Processors and Flexible Memory, naming Roderick Hyde, Nicholas Pasch, and Clarence T. Tegreene as inventors, filed 30 Nov. 2012, which is currently co-pending or is an application of which a currently co-pending application is entitled to the benefit of the filing date; and For purposes of the USPTO extra-statutory requirements, the present application constitutes a continuation-in-part of U.S. patent application Ser. No. 13/725,788 entitled Random Number Generator Functions in Memory, naming Roderick Hyde, Nicholas Pasch, and Clarence T. Tegreene as inventors, filed 21 Dec. 2012, which is currently co-pending or is an application of which a currently co-pending application is entitled to the benefit of the filing date.

For purposes of the USPTO extra-statutory requirements, the present application constitutes a continuation-in-part of U.S. patent application Ser. No. 13/738,747 entitled Data Security and Access Tracking in Memory, naming Roderick Hyde, Nicholas Pasch, and Clarence T. Tegreene as inventors, filed 10 Jan. 2013, which is currently co-pending or is an application of which a currently co-pending application is entitled to the benefit of the filing date.

For purposes of the USPTO extra-statutory requirements, the present application constitutes a continuation-in-part of U.S. patent application Ser. No. 13/738,788 entitled Multi-Core Processing in Memory, naming Roderick Hyde, Nicholas Pasch, and Clarence T. Tegreene as inventors, filed 10 Jan. 2013, which is currently co-pending or is an application of which a currently co-pending application is entitled to the benefit of the filing date.

RELATED APPLICATIONS

None.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, Benefit of Prior-Filed Application, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

The present disclosure relates to electronic memory and systems associated with electronic memory.

SUMMARY

In one aspect, a computer system includes but is not limited to a primary processing circuitry, a bus coupled to the primary processing circuitry, and memory circuitry coupled to the bus. The memory circuitry is physically separated from the primary processing circuitry. The memory circuitry includes at least one integrated memory circuit and computational circuitry. The at least one integrated memory circuit configured to store and retrieve data and to provide to the bus, during accessing intervals, requested data for the primary processing circuitry. The computational circuitry co-located with the at least one integrated memory circuit, the computational circuitry co-located with integrated memory circuit can be configured for performing supplemental functions at least partially during time periods that are not accessing intervals.

In one aspect, a system includes but is not limited to a memory storage circuitry configured for interaction with a memory bus, and memory control circuitry co-integrated and co-located with memory storage circuitry. The memory control circuitry can be configured for Restricted Cache Coherence Protocol.

In one aspect, a method of local computation in a memory device includes but is not limited to locally determining whether a memory line has been checked out for writing and, upon determining that the memory line has not been checked out for writing, retrieving data from at least one location associated with the memory line. The method of local computation in the memory device can further include performing a local action and/or computation involving the retrieved data.

In one aspect, a method of providing data to a memory bus includes but is not limited to retrieving in a first memory device a first data set, performing at the first memory device a first local action and/or computation involving the retrieved first data set, and providing an indication directly to a second memory device coupled to the memory bus of a status of the first local action and/or computation. The method of providing data to the memory bus can further include performing a second local action and/or computation at the second memory device responsive to the provided indication.

In one aspect, a method of performing a computation includes but is not limited to performing a local action and/or computation at a first memory device, and defining a retrieval strategy for the first memory device based on the local action and/or computation at a first memory device.

In one aspect, a method of performing a computation includes but is not limited to storing Markov data in a first location in a first portion of a memory device, retrieving stored Markov data from the first location, and performing a local action and/or computation responsive to the retrieved stored Markov data.

In one aspect, a method of performing a computation includes but is not limited to storing a stride length in a first location in a first portion of a memory device, retrieving stored stride length from the first location, and performing a local action and/or computation responsive to the retrieved stored stride length.

In one aspect, a method of performing a computation includes but is not limited to storing a stream sequence in a first location in a first portion of a memory device, retrieving stored stream sequence from the first location, and performing a local action and/or computation responsive to the retrieved stored stream sequence.

In one aspect, a memory device includes but is not limited to a characterizing memory portion associated with computational circuitry. The characterizing memory portion associated with computational circuitry has a first set of response parameters. The memory device further includes a primary memory portion that has a second set of response parameters different from the first set of response parameters.

BRIEF DESCRIPTION OF THE DRAWINGS

Embodiments of the invention relating to both structure and method of operation may best be understood by referring to the following description and accompanying drawings:

FIGS. 1A and 1B are multiple schematic block diagrams depicting embodiments of a computer system that includes memory circuitry with embedded computational functionality which can supplement functionality of circuitry remote from the memory circuitry.

FIGS. 2A and 2B are respective top and side views of schematic block diagrams illustrating embodiments of a system that is adapted to support a Restricted Cache Coherence Protocol.

FIGS. 15A and 15B are schematic flow charts depicting several embodiments and/or aspects of a method for providing data to a memory bus.

FIGS. 17A through 17C are schematic flow charts illustrating several embodiments and/or aspects of a method for performing a computation.

FIGS. 18A through 18C are schematic flow charts depicting several embodiments and/or aspects of a method for performing a computation.

FIGS. 19A through 19C are schematic flow charts showing several embodiments and/or aspects of a method for performing a computation.

DETAILED DESCRIPTION

Figure 3A:
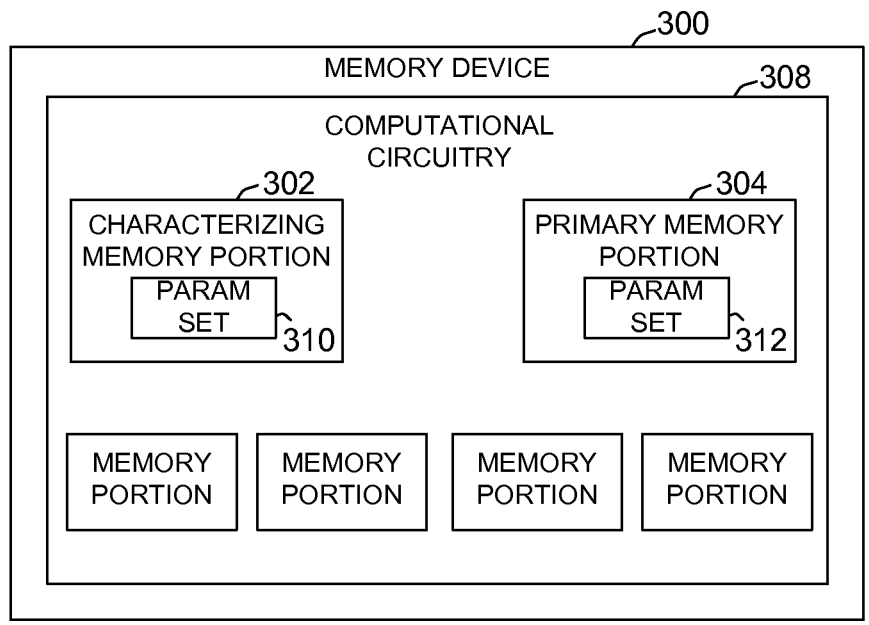
FIGS. 3A and 3B are respective top and side views of schematic block diagrams showing embodiments of a memory device formed with multiple memory portions including at least one characterizing memory portion.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

While various aspects and embodiments have been disclosed herein, other aspects and embodiments will be apparent to those having ordinary skill in the art. The various aspects and embodiments disclosed herein are for purposes of illustration and are not intended to be limiting, with the true scope and spirit being indicated by the following claims.

The various memory systems and devices disclosed herein are expected to be useful in many applications and contexts, and are further anticipated to be particularly useful in cloud computing and mobile contexts. In some configurations, the disclosed memory systems and devices can be used in system-on-a-chip (SOC) applications as processing and memory are distributed in more and more locations and applications throughout our technologically advancing society. The various memory systems and devices can include non-volatile memory including flash memory and electrically erasable programmable read-only memory (EEPROM) for usage in many electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In various applications and contexts, memory systems can include non-volatile memory integrated with a processor or other control logic, and a bus or other communications interface. As non-volatile memories and integrated system continue to evolve, their role in overall systems continue to expand to include various aspects of computation that is facilitated, for example, by phase-change memory in which passage of current switches a memory material between two states, crystalline and amorphous, or additional states that further elevate storage capacity.

Referring to FIGS. 1A and 1B, multiple schematic block diagrams depict embodiments of a computer system 100 that includes memory circuitry 104 with embedded computational functionality which can supplement functionality of circuitry remote from the memory circuitry 104. The illustrative computer system 100 includes primary processing circuitry 102 and memory circuitry 104 in a configuration in which the memory circuitry 104 combines an integrated memory circuit 106 with computational circuitry 108 that supplements computational functionality of the primary processing circuitry 102. The illustrative computer system 100 includes primary processing circuitry 102, a bus 110 coupled to the primary processing circuitry 102, and memory circuitry 104 coupled to the bus 110. The memory circuitry 104 is physically separated from the primary processing circuitry 102. The memory circuitry 104 includes at least one integrated memory circuit 106 and computational circuitry 108. The at least one integrated memory circuit 106 configured to store and retrieve data and to provide to the bus 110, during accessing intervals, requested data for the primary processing circuitry 102. The computational circuitry 108 co-located with the at least one integrated memory circuit 106, the computational circuitry 108 co-located with integrated memory circuit 106 being configured for performing supplemental functions at least partially during time periods that are not accessing intervals.

The memory circuitry can facilitate intelligent monitoring by virtue of a large distributed area of processing or logic which can be spread over a relatively large area of memory storage. In some embodiments, the processor can be formed of logic that is relatively low capability or relatively low quality, for example to enable a small number of relatively simple operations, thereby reducing the number of layers of silicon in the integrated circuit chip, and possibly reducing power requirements and heat dissipation. The processing logic of such a processor-in-memory (PIM) can be widely distributed over the area of memory storage. The intelligent monitoring memory circuitry can be formed as at least part of a system-on-a-chip (SOC).

In various embodiments, the memory circuitry can include control logic formed in a limited number of metal layers within the memory logic. To avoid stacking of multiple layers of silicon processing on the memory chip, the control logic can be spread laterally across the memory array circuitry. Limited complexity of operations implemented on the memory circuitry enables slower computation speed in comparison to a typical central processing unit (CPU). Such slower computation speeds are suitable since the limiting factor in transfers of data from a processor to memory is the data bus.

The control logic can be configured to reduce the percentage of transistor underutilization, called "dark silicon", by breaking up of the command structure of central blocks. The control logic can be further configured to enhance efficiency by performing background operations such as sorting of data within the memory while the system is idle.

In some embodiments, the memory circuitry can be configured with control logic with an abbreviated set of specific, basic functions in which simple operations can be off-loaded from a processor external to the memory circuitry and moved onto the memory circuitry. For example, context request blocks can be removed from the processor into the memory circuitry, for example for security purposes since the context request blocks are typically not located in the memory.

Embodiments of the memory circuitry with a reduced-functionality control logic can facilitate efficient operation of the memory circuitry while maintaining the integrated circuit simplicity and yield of the memory circuitry. Typically, the number of metal layers in a memory integrated circuit is substantially smaller than that of a processor circuit. Reducing the complexity of the control logic can allow fabrication with fewer metal layers.

In various embodiments, functionality control logic can be attained by one or more of several techniques. For example, computations can be simplified by implementing relatively simple tasks in the control logic or by acknowledging that a particular section of the memory is predominantly subject to a limited number of simple operations which can be implemented in the control logic while other operations that rarely are applied to the memory section can be performed by processing external to the memory circuitry. In another example, for operations or applications characterized by a limited or coarse accuracy, such as relatively low-grade video signals, processing can be based on estimation. In a further example, the control logic can include support for multiple functions in which circuitry for the different functions can be spread over a distributed area of the non-volatile memory array, forming a large distributed area of simple processing functionality.

Various techniques may be used for forming an integrated circuit with a combination of the non-volatile memory array and the control logic. In one example technique, an integrated circuit for a non-volatile memory cell transistor can be formed by constructing a layer of discrete storage cells over a substrate in two substrate regions, applying a dielectric layer over the layer of discrete storage cells in the two substrate regions, and building a barrier layer over the dielectric layer in the two regions. The barrier layer, dielectric layer, and the layer of discrete storage cells are then removed in one of the two substrate regions, leaving the layers intact in the other of the two substrate regions. An additional barrier layer is then formed over the substrate in the two substrate regions, then removed from the substrate region from which the barrier layer, dielectric layer, and the layer of discrete storage cells were previously removed. Two gates of a memory element are then formed respectively in the two substrate regions with one gate including a portion of the first barrier layer and another gate including a portion of the additional barrier layer. One aspect of fabricating a circuit that integrates the non-volatile memory array and the control logic on the memory circuitry is selection of a suitable annealing process. For example, the illustrative integrated circuit can include a charge storage layer and a barrier layer formed over both a non-volatile memory region and a logic region. The charge storage layer can be formed of one or more layers and can include multiple discrete storage cells for storing charge which are isolated by a dielectric layer of insulating material with a suitably high dielectric constant. The charge storage layer can be constructed by depositing and annealing the discrete storage cells (for example, one or more of a silicon material such as polysilicon, silicon carbide, or the like, or a suitable metal such as germanium) on a dielectric area. The thermal annealing action can be performed by rapid thermal annealing (RTA) or a slower annealing process such as laser spike annealing (LSA). Memory properties can be selected and controlled by optimizing the annealing condition, thereby resulting in an improved reliability, write durability, and failure resistance.

In another example technique for forming an integrated circuit with a combination of the non-volatile memory array and the control logic, a non-volatile memory cell with improved charge retention on a substrate common with logic devices using a single-gate logic process in which a silicide-blocking dielectric barrier is formed over a floating gate of a non-volatile memory cell so that silicide cannot be formed over the floating gate but is formed over logic devices, thereby preventing bridging and silicide spiking in the non-volatile memory cell. The silicide-blocking dielectric barrier prevents silicide metal from contacting the floating gate or sidewall spacers while allowing the silicide metal in parts of active regions of the non-volatile memory cell at locations removed from the floating gate and spacers. The silicide regions can be constructed by initially depositing a refractory metal layer over the surface of the non-volatile memory cell, followed by a reactive anneal which causes the metal layer to react with the underlying contacted silicon regions to form silicide regions. A metal strip removed unreacted portions of the metal layer but leaves the silicide regions which are formed by a logic process using metals such as titanium, cobalt, nickel, or the like. A relatively slow annealing process can be used to produce suitable memory performance.

In a further example technique for forming an integrated circuit with a combination of the non-volatile memory array and the control logic, a scalable, logic transistor can be constructed with drain and source formed as a pair of doped regions and a gate insulator layer formed over the substrate and between the drain and source. A gate stack can include a gate layer (polysilicon or metal) between two metal nitride layers. A non-volatile memory transistor that is compatible with the logic transistor can be added via a high-K dielectric constant film with an embedded metal nano-dot layer between a tunnel insulator and the gate stack. The drain and source doped regions can be n+ regions doped into a p-type substrate to form an n-channel Field Effect Transistor (FET) device. The diffusion regions can be formed using n+ doped amorphous silicon, followed by an anneal such as a rapid thermal anneal (RTA) to reduce thermal budget and silicidation. A p-channel FET can similarly be formed via p+ diffusion source/drain regions applied over an n-well region. In other embodiments, annealing can be performed using a slow annealing process to improve memory performance and write durability while reducing stress and defects.

In an additional example technique for forming an integrated circuit with a combination of the non-volatile memory array and the control logic, non-volatile memory process steps can be added to a processor for forming high-voltage complementary metal-oxide semiconductor (CMOS) devices. The fabrication technique can include formation of isolation areas for the non-volatile memory and the high-voltage CMOS elements, forming high thermal drive process elements of both the memory and CMOS cells, forming mid thermal drive process elements of the logic CMOS cells, and forming low thermal process elements for logic CMOS, non-volatile memory, and high-voltage CMOS cells. Dopants for forming the devices can include masked implantation of boron, phosphorus and other species and subsequent annealing of the dopings, for example, using a slow annealing process to enhance charge retention in the memory circuitry.

The non-volatile memory can be formed of one or more of any non-volatile memory type or technology including read-only memory, flash memory, ferroelectric random access memory (F-RAM), magneto-resistive RAM (M-RAM) or the like.

In various embodiments, the memory circuitry can include multiple types of memory technology, for example including charge memory or resistive memory. Memory circuitry can include sections of charge memory and resistive memory and the control logic can assign applications to exploit the advantages and diminish the consequences of disadvantages of either type of memory. Charge memories induce a voltage which is detected during read operations in response to require amounts of charge. In nonvolatile storage, flash memories precisely control the discrete charge placed on a floating gate. In volatile storage, DRAM not only places charge in a storage capacitor but also mitigate subthreshold charge leakage through the access device using capacitors that are sufficiently large to store charge for reliable sensing and using transistors that are sufficiently large to exert effective control over the channel. Resistive memories use electrical current to induce a change in atomic structure, changing the resistance detected during reads. Resistive memories are more suitable for scaling than charge memories by avoiding precise charge placement and control. Programming via techniques such as current injection scale with cell size. Phase-change memory (PCM), spin-torque transfer (STT) magneto-resistive RAM (M-RAM), and ferroelectric RAM (FRAM) are examples of resistive memories.

In some embodiments of the system depicted in FIGS. 1A and 1B, the computer system 100 can be configured such that the computational circuitry 108 co-located with integrated memory circuit 106 is configured to present supplementally calculated data in coordination with the requested data.

In various configurations, the computational circuitry can be distributed in memory and use the bus for communication with devices external to the memory circuitry such as the primary processing circuitry or one or more processors. The memory circuitry can facilitate communication and handle additional bandwidth via usage of computational circuitry that can predict subsequent transfers and write to memory accordingly to enable processing on the predicted data values. In some embodiments, the memory circuitry can include communication channels in addition to the bus to facilitate transfer of information for various management functions, alleviating the traffic on the bus.

In selected embodiments of the system depicted in FIGS. 1A and 1B, the computer system 100 can be formed in a manner in which the supplemental functions include at least searching such as functions that facilitate operations of search engines. Various aspects of search engine functionality can include partial or full operations for web search engines, database or structured data search engines, mixed search engines or enterprise searches, and the like. The supplemental functions can complement actions of hundreds of thousands of millions of computers to process trillions of web pages to return fairly well-focused results. The computational circuitry can thus assist a high volume of queries and text processing, executing in a highly dispersed environment with a high degree of superfluity.

The computational circuitry can include components of searching functionality such as adaptation for performing various aspects for searching web pages, documents, images, and the like, including basic actions to facilitate searching through a large, unstructured masses of data. The computational circuitry can include atomic operations for multiple-stage process such as crawling through massed pages and documents in the memory or passing over the bus to detect contents, index aspects of the data in a structured or partially structured form, resolving user entries/queries, and the like to detect and replay with relevant results and links to those skimmed documents or pages from the memory.

In some embodiments, the computational circuitry can include logic for assisting text searching. The logic can facilitate classification of web pages by finding index items that in some manner relate to a search term. The logic can support rudimentary searching, for example, by including support for maintaining a seed list of Uniform Resource Locator (URL) codes, fetching content, parsing links on identified pages for relevant information, and accumulating new links via incidental discovery. In some implementations, the logic can support a continuous crawl search technique which does not use a seed list and forms multiple possible search terms based on incomplete entries. The logic can further include support for scheduling algorithms that determine when to revisit a page such as according to a determined visit interval, according to priority based on frequency of page updating, popularity, quality, resource speed or bandwidth, randomly, and the like.

In other embodiments, the computational circuitry can include logic for distributing pages discovered via web crawls and creating and developing a map of resources found during processing. The logic can further create and accumulate trees including nodes connected by links between pages, for example, by selectively assisting storage of data in multiple data structures and supporting algorithms for performing link analysis by computing a page popularity score based on the number of links to a particular web page. The logic can include support for differentiating between internal links and external links, storing anchor text embedded in the links, summarizing page content, and the like.

In further embodiments, the computational circuitry can include logic for searching text-based content in databases including support for solving complex queries with multiple logical or string matching arguments, support for pseudo-logical queries, indexing data in an economized form for faster searching.

The computational circuitry can additionally include logic that facilitates handling of search data that includes a combination of database content, web pages, documents, and the like, addressing different aspects of searching for the various content types. For example, the logic can include some components adapted for structured data sources and other components adapted for unstructured data sources. In a particular example, the logic can include components for determining the specific alternative of a search term with multiple definitions according to context of other terms in the search. In some embodiments, the logic can include components that implement a selected group of search rules.

In additional embodiments of the system depicted in FIGS. 1A and 1B, the computer system 100 can be formed in a manner in which the supplemental functions include at least sorting. In some embodiments, the computational circuitry can be operable to perform operations such as sorting of data the computer system is idle.

During a sorting operation, the computational circuitry can facilitate ordering of elements of a list in a predetermined order such as numerical order or lexicographical order. Efficient sorting can optimize the use of other algorithms such as search and merge algorithms in which data accessed from the bus is placed in sorted lists. Sorting is also useful for canonicalizing data and producing data in a human-readable form so that the sorted information is placed in nondecreasing order with each element no smaller than the previous element according to a desired order, and the sorted information is a permutation or ordering of the received information.

In various embodiments and/or applications, the computer system can include computational circuitry that implements sorting logic for performing any suitable sorting function, typically involving comparison and swapping of data. The sorting logic, for example, can perform a bubble sort in which elements are compared and swapped if out of order, repeating until no swaps have occurred. In another example scheme, the sorting logic can perform an in-place comparison sort or selection sort by finding the minimum value, swapping with the value in the first position, and repeating for the remainder of the list. In a further technique, the sorting logic can perform an insertion sort by taking elements from a list sequentially and inserting in the correct position into a new sorted list. Similarly, the sorting logic can perform a shell sort by moving out-of-order elements more than one position at a time, for example arranging the data sequence in a two-dimensional array and then sorting the columns of the array using the insertion sort. Other suitable sorting techniques include a merge sort which merges already sorted lists into a combined list by comparing every two elements sequentially multiple times, quiksort, counting sort, bucket sort, radix sort, distribution sort, and the like.

In further embodiments of the system depicted in FIGS. 1A and 1B, the computer system 100 can be constructed such that the supplemental functions include at least accessing and creating indices for databases. The memory circuitry can form at least part of a data structure and the computational circuitry can support a database index, which is a data structure used to improve speed of data retrieval operations on a database table. Indices can be created using one or more columns of a database table, enabling efficient random lookup and access of ordered records.

In a relational database, an index can be a copy of a portion of a table. The computational circuitry can include logic that improves the power of database indexing by enabling indices to be created on functions or expressions or by using filtered indices in which index entries are formed only for records that comply with a predetermined conditional expression. In some implementations, the computational circuitry can include logic elements that facilitate indexing on user-defined functions, expressions formed from multiple component functions, and the like.

In various embodiments, the computational circuitry can include logic components that support fast lookup. One example logic component can be indexing logic that enables sub-linear time lookup to improve performance since linear searching is inefficient for large databases. Indices can be used to manage database constraints such as UNIQUE, EXCLUSION, PRIMARY KEY and FOREIGN KEY. An index declared as UNIQUE creates an implicit constraint on the underlying table. Database systems can implicitly create an index on a set of columns declared PRIMARY KEY, and can use an existing index to manage the PRIMARY KEY constraint. Some database systems can use both referencing and referenced sets of columns in which indexing uses a FOREIGN KEY constraint, improving performance of inserts, updates and deletes to the tables participating in the constraint. Some database systems can support EXCLUSION constraint, ensuring for a newly inserted or updated record that a selected predicate will hold for no other record, for example, for implementing a UNIQUE constraint with equality predicate or more complex constraints, such as preventing overlapping time ranges or storage of intersecting geometry objects in the table.

Similarly, the computational circuitry can include support for various types of indexes such as a bitmap index, a dense index, a reverse index, a sparse index, and the like. For example, the computational circuitry can support a bitmap index that stores at least part of the data as bit arrays or bitmaps, and responds to queries by performing bitwise logical operations on the bitmaps. The computational circuitry can support a dense index in the form of a file with pairs of keys and pointers for records in the data file. The keys are associated with a corresponding pointer to a record in the sorted data file. The computational circuitry can support a reverse index in which a reverse key index reverses the key value before entering into the index. Reversing the key value is useful for indexing data such as sequence numbers, in which new key values monotonically increase. The computational circuitry can support a sparse index in the form of a file with pairs of keys and pointers for every block in a data file. Keys in the file are associated with a particular pointer to the block in the sorted data file.

Indices can be implemented using various data structures such as balanced trees, B+ trees, hashes, and the like. In selected embodiments, the computational circuitry can be operable to monitor memory accesses, determine statistics on type and number of instructions of the monitored memory accesses, and predict a sequence of instructions and data using the determined statistics. The logic can oversee operations of an overall system, maintaining statistics on the type and number of instructions communicated and processed. In some embodiments, logic can be operable to monitor memory accesses, detect a pattern of instructions and data from the monitored memory accesses, predict expected instructions and data from the detected pattern of instructions and data using, for example, a probability sampling, and preprocessing the predicted expected instructions. In probability sampling, instructions and/or data in the population of instructions and/or data can have a greater than zero probability of being selected in the sample, and the probability can be accurately determined. In some applications, the logic can use the statistics to predict a future sequence of instructions and data. The logic can detect patterns in which a first sequence of data and/or instructions is commonly followed by a second sequence. Upon detection of such a first sequence, the logic can apply the second sequence to the memory without actually receiving the second sequence, for example from a processor via the data bus. Thus, the logic can accelerate data handling and work throughput. The logic can monitor data and/or instructions and anticipate requests for memory. The logic can also detect an indexing pattern of instructions and interactions with memory using specialized logic that is integrated into the non-volatile memory area, enabling preprocessing of expected instructions within the memory. The logic thus can perform statistical operations that analyze instruction sequences to predict the type of instructions to perform using logic that is distributed within the non-volatile memory arrays of the computational circuitry.

In a specific example embodiment, the computational circuitry can facilitate management of resource allocation among multiple processes or tasks using keys which can be allocated at a selected granularity to indicate an association with a data object. Individual processes or modules can be allowed access to memory portions assigned to one or more data objects. The computational circuitry can include protection key logic for controlling access to selected memory portions based on whether a protection key currently loaded in the protection key register allows access to the memory portion(s). In a specific example, an individual portion of memory can be assigned a key number that indexes into a protection key set. The currently loaded protection key set identified memory portion key numbers that can be accessed by a process attempting access. A key in the protection key set can be associated with one or more data objects or groups of data objects, identifying currently accessible data objects or groups of data objects. In a particular example embodiment, the protection key logic can manage access to memory using a protection key set in the form of a bit vector indexed to memory portion key numbers. The protection key set can be indexed to memory portion key numbers for read requests and indexed to memory portion key numbers for write requests. A bit set at individual indexed key number locations can identify whether a particular type of access is enabled.

In some embodiments and/or applications, the computational circuitry can support hash logic that can be used in conjunction with the processing logic on the computational circuitry for various purposes. For example, a pseudo-random number generator function P(key) can be uniform on an interval $[0, 2^{b-1}]$ and a hash function uniform on the interval $[0, n-1]$ is $nP[key]/2^b$ so that a division operation can be replaced by a more simple and possibly faster right bit shift, $nP(key) \gg b$, in an operation that can simplify the logic in the computational circuitry. In another example operation, hashing logic in the computational circuitry can be formed to perform hashing by nonlinear table lookup in which tables of random numbers can enable high-quality nonlinear functions to be used as hash functions or other purposes such as cryptography. The key to be hashed can be divided into parts with individual parts used as an index for a nonlinear table. Table values can be added by arithmetic or XOR addition to the hash value, reducing memory size and enabling fast hash execution, which can be particularly beneficial in a computational circuitry that includes simplified logic integrated with the non-volatile memory.

In certain applications and/or embodiments of the memory circuitry depicted in FIGS. 1A and 1B, the memory circuitry can be formed such that the computational circuitry can be operable to monitor memory accesses, detect a pattern of instructions and data from the monitored memory accesses, predict expected instructions and data from the detected pattern of instructions and data, and preprocessing the predicted expected instructions. In some applications, the computational circuitry can use the statistics to predict a future sequence of instructions and data. The computational circuitry can detect patterns in which a first sequence of data and/or instructions is commonly followed by a second sequence. Upon detection of such a first sequence, the computational circuitry can apply the second sequence to the memory without actually receiving the second sequence, for example from a processor via the data bus. Thus, the computational circuitry can accelerate data handling and work throughput. The computational circuitry can monitor data and/or instructions and anticipate requests for memory. The computational circuitry can also detect an indexing pattern of instructions and interactions with memory using specialized logic that is integrated into the non-volatile memory area, enabling preprocessing of expected instructions within the memory.

The computational circuitry thus can perform statistical operations that analyze instruction sequences to predict the type of instructions to perform using logic that is distributed within the non-volatile memory arrays of the memory circuitry.

Some embodiments of the memory circuitry depicted in FIGS. 1A and 1B can include memory circuitry that can operate independently of external control, for example by a processor. Thus, the computational circuitry can be operable to perform selective memory access and management operations independently of signals external to the memory circuitry.

In various embodiments of the system depicted in FIGS. 1A and 1B, the computer system 100 can be created in which the supplemental functions include at least array computations. Accordingly, the computational circuitry can contain logic that operates upon one or multiple-dimensional arrays of data termed vectors. Array computations can improve performance on workloads such as numerical simulation and similar tasks. The computational circuitry can include support for instructions for vector processing on vectorized data sets. The computational circuitry can include support for manipulating one or two portions of data concurrently, for example, by facilitating instruction pipelining in which a portion of the logic can read and decode an address while another portion of logic fetches values at the addresses, and an additional portion performs a calculation or other action. Thus, the computational circuitry can process multiple operations faster and more efficiently than if the operations were performed sequentially. In further implementations, the computational circuitry can pipeline not simply instructions but also data.

In example embodiments of the system depicted in FIGS. 1A and 1B, the computer system 100 can be created in which the array computations include one or more of least squares computations; maximum, minimum, and/or equality computations; and statistical computation.

In particular embodiments, the computational circuitry, including processing logic adapted for executing multiple parallel processing tasks, can perform pattern recognition in an integrated circuit chip and perform analysis in operations that are background to data communication via a bus to a device such as a processor external to the computational circuitry. Background tasks that are local to the computational circuitry can include maximum and minimum sorting, medium, and mode computation. Operations perform by the logic can include statistical measurements, indexing, synchronizing, detection of repetitive tasks, and the like.

Computational circuitry that supports least squares processing determines an approximate solution of overdetermined systems in which sets of equations have more equations than unknowns. Least squares determines an overall solution that minimizes the sum of the squares of the errors in results of each single equation. In an example application, the computer system can include computational circuitry which supports signal processing techniques which estimate transforms between signals using a least squares technique. Logic can use a seed set of transform candidates and use a least squares technique to apply a seed transform candidate to a reference signal and determine correlation between the transform candidate and a monitored signal. Update coordinates of reference signal features are determined in the monitored signal and applied to least squares analysis to update the transform candidate, iterating to improve correlation.

In another example configuration, the computational circuitry can include logic adapted to perform estimation using an iteratively reweighted least squares technique applied to a design matrix, a weight matrix, a response vector, and a parameter to be estimated. A least squares estimate can be determined during multiple iterations with the weight matrix updated according to the least squares estimate, intermediate values determined based on the design matrix and weight matrix, and based on a combination of the design and weight matrices and the response vector. An updated least squares estimate can be determined based on the intermediate values.

Computational circuitry that supports maximum, minimum, and/or equality computations can perform processing of queries that include maximum, minimum and/or equality conditions for application to a single-scan of a table specified by a query. The computational circuitry can include logic which supports scanning of the table and tracking of a row or rows in the table which includes an attribute value on which the equality condition is applied that is greater than or equal to a maximum attribute value for maximum processing; is less than or equal to a minimum attribute value for minimum processing; or is equal to an equality attribute value for equality processing. The logic can perform overall aggregation to produce a result of the query without rescanning.

In a further example embodiment of computational circuitry that supports maximum, minimum, and/or equality computations can perform processing of queries by transforming maximum or minimum function aggregation predicates on a non-indexed column into a single sort function, evaluating the query to identify a table and a predicate equating a column of the table to a sub-query that applies a maximum or minimum aggregation function to the column to return an aggregate value for the column. The aggregate value can be used to select rows from the table to determine a query result and whether an index has been created using the column of the table, reforming the query as a sort function on the column, which is used to scans the table to produce the query result.

In other example embodiments of the computer system depicted in FIGS. 1A and 1B, the memory circuitry can be constructed with computational circuitry that is operable to monitor memory accesses and perform pattern recognition of the monitored memory accesses. In particular embodiments, the control logic can perform pattern recognition in an integrated circuit chip and perform data analysis in operations that are background to data communication via a bus to a device such as a processor external to the computational circuitry. Background tasks that are local to the computational circuitry can include maximum and minimum sorting, medium, and mode computation. Operations perform by the control logic can include statistical measurements, indexing, synchronizing, detection of repetitive tasks, and the like.

Some embodiments of the computer system depicted in FIGS. 1A and 1B, the memory circuitry may include a capability to perform statistical analysis. Accordingly, the computational circuitry can be operable to monitor memory accesses, determine statistics on type and number of instructions of the monitored memory accesses, and predict a sequence of instructions and data using the determined statistics. The control logic can oversee operations of an overall system, maintaining statistics on the type and number of instructions communicated and processed.

In further additional embodiments of the system depicted in FIGS. 1A and 1B, the computer system 100 can be created to include computational circuitry supporting supplemental functions that include at least garbage collection. Garbage collection is a form of memory management which operates to reclaim garbage in the form of memory occupied by objects that are no longer in use. Actions of garbage collection include finding of data objects that cannot be accessed in the future and reclaiming of resources used by the found data objects.

In an example embodiment, the computer system can include computational circuitry that supports estimation of the sum of pause times for garbage collection of objects within a memory space and controlling the garbage collection process in a manner that the sum of pause times for garbage collection is lower than a predetermined limit. A preselected compaction area can be pre-compacted to maintain compaction time within the specified limit. Logic can predict the time for final marking and repetitively preclean until the predicted final marking time is within the pause time limits, and can improve pause times by redirecting application worker threads to perform garbage collection when entering or leaving the memory subsystem.

In a further example embodiment and/or application, the computer system can include computational circuitry that supports incremental garbage collection in a secondary storage, for example by locating data blocks in a log. The data blocks can be referenced within a predetermined range at a specified location in the log. Referenced blocks of data within the range can be copied to an unallocated part of the log.

In an additional example embodiment, the computer system can include computational circuitry that supports distributed garbage collection in a pipelined workflow environment that includes multiple processing nodes which are operable to mutually communicate via pass item references. Multiple items of memory circuitry can be distributed in multiple nodes and the computation circuitry at the individual nodes can maintain a reference list of local item references and a reference dictionary of remote item references. Logic in the computation circuitry can periodically synchronize the reference list with the reference dictionaries of other nodes in the workflow in a manner that item references are not marked for garbage collection as long as other processing nodes retain outstanding references.

The computational circuitry can implement a myriad of garbage collection actions and functions. In various embodiments, the computational circuitry can access, if available, background information about data characteristics and applications to tailor the memory to the currently-execute application.

In some embodiments, the memory circuitry can include computational circuitry that is configured to monitor current patterns in the memory and analyze using entropy laws, for example by determining the fluctuations in data using statistical mechanics techniques. The computational circuitry can monitor memory accesses and determine the relative probability that the entropy of the data is currently outside an equilibrium level and so the data is expected to be characterized by increases or decreases over time. The entropy of an isolated system is expected to increase until reaching equilibrium.

In various embodiments, the memory circuitry can include a non-volatile memory array which includes one or more suitable memory technology. For example, memory technologies in the memory circuitry can include embedded flash, read-only memory (ROM), electrical fuse (one-time programmable), CMOS floating gate (multiple time programmable), CMOS floating gate (one-time programmable), and anti-fuse (one-time programmable). The different memory technologies can have various advantages and disadvantages for particular operations or applications.

Some memory technologies can have relatively high density such as ROM and antifuse, while others have low density (for example electrical fuse and CMOS floating gate). Some technologies have good endurance such as embedded flash, and CMOS floating gate, while others have poor endurance, for example ROM, electrical fuse, CMOS floating gate, and antifuse. Various technologies can have different standby and active current including high current (electrical fuse), medium current (embedded flash and CMOS floating gate), and low current (ROM and antifuse). The memory technologies vary in random access time including fast (ROM and antifuse), medium (embedded flash and CMOS floating gate), and slow (electrical fuse). The memory technologies vary in security including high security (antifuse), medium security (embedded flash and CMOS floating gate), and slow security (ROM and electrical fuse). The memory technologies vary in high and low temperature and voltage tolerance including high tolerance (ROM and antifuse), medium tolerance (electrical fuse), and low tolerance (embedded flash and CMOS floating gate). In a memory circuitry that includes multiple memory sections with more than one memory technology, the computational circuitry can monitor a history and pattern of memory accesses and assign memory usage depending on the monitoring. For data or code that changes very frequently, the computational circuitry can assign embedded flash. For high volume storage, the computational circuitry can assign more dense memory technologies. For applications in which the code changes infrequently, the computational circuitry can allocate, for example, ROM and antifuse. The computational circuitry can assign memory accesses depending on temperature and voltage conditions that can be measured using sensors or otherwise communicated to the memory circuitry. The computational circuitry can determine the security level of an application and assign the memory technology accordingly.

In some embodiments, the memory circuitry can include computational circuitry that write-protects a selected location, block, or portion of memory. Subsequent erroneous write to the protected area can activate the computational circuitry to perform predetermine handling such as repairing an error, performing an exit and restart, generating an error report, or the like.

In several embodiments and/or applications of the memory circuitry depicted in FIGS. 1A and 1B, the memory circuitry can be configured with computational circuitry that is operable to monitor operating characteristics of the memory circuitry, analyze the monitored operating characteristics, detect a precursor to a memory failure based on the analysis, and allocate memory accesses based on the detected precursor. Accordingly, the computational circuitry can be used to predict how and when failures will take place using any suitable information for making the prediction. For example, the computational circuitry can use temperature measurements to predict failure or use various forms of information to make predictions. In a particular embodiment, the computational circuitry can enable writing data at a high rate in some conditions and limit writing speed in other conditions. For example, at high temperatures for a memory that is susceptible to failure, the computational circuitry can limit writing speed to a low rate while allowing higher write data rates at lower temperature. In some applications or contexts, the computational circuitry can perform performance mapping at selected time intervals, for example updating a map of sections of memory every 10,000 writes. The operating logic can determine how the memory is used and project back to determine characteristics of the operating environment.

Different types of memory can have different operating characteristics. The computational circuitry can be formed of multiple memory segments that have different operating characteristics, for example in aspects of speed, power consumption, size, as well as susceptibility or resistance to particular operating conditions such as magnetic field characteristics, temperature, and voltage. The computational circuitry can operate as a memory controller integrated with the non-volatile memory array to optimize for the particular memory type depending, for example, on application constraints such as the amount of computation, energy consumption load, and many other conditions. For example, computational circuitry metadata can supplies intra-memory hints about heat generation.

For example, in some embodiments, the computational circuitry can include both phase change memory (PCRAM) and other memory types and the computational circuitry can assign memory usage according to various operating characteristics such as available power. In a specific example, PCRAM and DRAM may be selected based on power considerations. PCRAM access latencies are typically in the range of tens of nanoseconds, but remain several times slower than DRAM. PCRAM writes use energy-intensive current injection, causing thermal stress within a storage cell that degrades current-injection contacts and limits endurance to hundreds of millions of writes per cell. In a computational circuitry that uses both PCRAM and DRAM, the computational circuitry can allocate memory usage according to the write density of an application.

A computational circuitry can allocate memory for a particular application or operation based on scalability, for example by determining whether a substantial number of storage cells is to be used. PCRAM can be a highly scalable memory technology since thermal resistivity increases, contact area decreases, and the volume of phase-change material to block current flow decreases with feature size. As feature size becomes smaller, contact area decreases quadratically, and reduced contact area causes resistivity to increase linearly, causing programming current to decrease linearly. Thus PCRAM can attain not only smaller storage elements but also smaller access devices for current injection, leading to lower memory subsystem energy. Thus, the computational circuitry can allocate PCRAM segments to applications characterized by large memory use and density.

In some embodiments and/or applications, the computational circuitry can be configured to allocate different portions of memory that have differing characteristics to specific applications. Some characteristics of memory can be better for some applications. For example, the computational circuitry can assign data in high-speed operations to high-speed memory while assigning less time-critical applications to slower memory. The computational circuitry can assign frequently updated information to memory types that are more durable to writes. In another example application, the computational circuitry can be used in an end-to-end image storage system which includes multiple types of memory including multiple types of non-volatile RAM. For example, the computational circuitry can be used to supply inexpensive memory such as memory stripes that are not part of a device such as a picture telephone, but is used to accumulate data (such as pictures) using some mirror communications that are facilitated by intelligence supplied by the computational circuitry. In an example application, the computational circuitry can activate to perform data communication when the computational circuitry is in a location sufficiently proximal to the picture telephone to enable data transfer. The computational circuitry can be used to detect that the picture telephone and the computational circuitry are sufficiently close to perform a data transfer and, if so, operate in a low operation, low power mode to perform the data communication. Accordingly, the intelligence of the computational circuitry can enable data transmission when the memory is in any location that is sufficiently close to the data source.

The computational circuitry can thus be used for a wide variety of data communication operations to enable concentration of data originating from many sources. In particular arrangements, a computational circuitry can include multiple types of memory with multiple memory characteristics in terms of cost, price, power, reliability, and the like. A computational circuitry can be optimized to any desired characteristic such as memory quality, memory power, cost in terms of number of electrons, noise, power consumption, and others. For example, power consumption can be optimized by lowering access threshold. The computational circuitry can be configured to determine the source of noise, for example if noisy during writing, the computational circuitry can determine how little write current can be used, thereby reducing power consumption. The computational circuitry can be used to monitor electrical characteristics such as power or charge. Only so many electrons are available in a memory and the computational circuitry can be configured to determine how few electrons can be used to perform a particular operation such as read/write operations.

In some embodiments, the computational circuitry can include some memory that is unacceptable for standard processing but very inexpensive and thus may have some usefulness and cost-effectiveness in some operations. For example, a relatively fast but error-prone memory may be useful for video processing. In various applications, the basis of memory quality may vary, for example, error rate, speed, and the like.

The computational circuitry can include multiple types of memory including the non-volatile memory array in the form of multiple types of non-volatile memory technologies, in addition to portions of memory that may be volatile. The computational circuitry may include multiple types of memory for use in a redundant fashion. Accordingly, the computational circuitry can include two or more memory segments of any non-volatile memory type or technology including read-only memory, flash memory, ferroelectric random access memory (F-RAM), magneto-resistive RAM (M-RAM) or the like. The computational circuitry can operate a segment of M-RAM which is comparable in speed and capacity to volatile RAM while enabling conservation of energy, rapid or instantaneous start-up and shutdown sequences. In other applications, the computational circuitry can include memory in the form of charge-coupled devices (CCDs) that are not directly addressable or other pure solid state memory that is reliable and inexpensive for use as separate computational circuitry for various applications such as cell phones, and the like.

In a computational circuitry that includes multiple different types of memory including a spin-transfer M-RAM, the computational circuitry can assign functionality at least in part based on the magnetic properties of memory. In a system that includes at least one portion of F-RAM, the computational circuitry can exploit operating characteristics of extremely high endurance, very low power consumption (since F-RAM does not require a charge pump like other non-volatile memories), single-cycle write speeds, and gamma radiation tolerance. The computational circuitry can include different segments of different types of memory including volatile and non-volatile memory, flash, dynamic RAM (DRAM) and the like, and use the computational circuitry to attain different performance/cost benefits.

The computational circuitry can, in addition to including multiple types of memory, can include multiple different classes of memory of the same memory type to attain a desired operating characteristic. The different classes of memory may include memory of the same technology with different operating parameters or different fabrication process parameters. The different classes of memory may be formed with different polysilicon types, different metal types, different silicides or salicides, various source, gate, and spacer dimensions, different annealing processes, and any other suitable variation in fabrication technique.

In some embodiments and/or applications, the computational circuitry can allocate instruction cache and data cache depending on the application and environment. In further arrangements, the computational circuitry can also select physical locations of memory depending on application and operating environment.

Thus, the computational circuitry can be operable to perform maintenance operations of the memory in response to physical phenomena imposes on the memory. For example, the computational circuitry can incorporate sensors or other components that detect phenomena which can be monitored by the computational circuitry to detect magnetic fields, electrical conditions, temperature, and the like to enable the computational circuitry to perform actions to maintain, repair, clean, or other operations applied to the memory.

Referring to FIGS. 2A and 2B, respective top and side views of schematic block diagrams illustrate embodiments of a system that is adapted to support a Restricted Cache Coherence Protocol. Accordingly, a system 200 can include memory storage circuitry 204 configured for interaction with a memory bus 210, and memory control circuitry 208 co-integrated and co-located with memory storage circuitry 204. The memory control circuitry 208 is configured for a Restricted Cache Coherence Protocol.

Cache coherency refers to the consistency of data stored in local caches of a shared resource. A shared memory multiprocessor system generally allocates a separate cache memory to a corresponding processor. Thus, many copies of a particular instruction operand can exist simultaneously including, for example, one copy in a main memory and one in individual cache memories. When one copy of an operand is changed, other copies of the operand must similarly be changed. Cache coherency ensures that changes in shared operands are propagated throughout the system in a timely manner.

A coherency protocol maintains consistency among all caches in a distributed shared memory system and maintains memory coherence according to a predetermined consistency model. Transitions between states in various protocols may vary, for example, using different update and invalidation transitions such as update-on-read, update-on-write, invalidate-on-read, or invalidate-on-write. The selection of transition technique may affect the amount of inter-cache traffic, the amount of cache bandwidth available for other operations, and contention between the caches of multiple processors.

An example system embodiment can include memory control circuitry 208 which supports a Restricted Cache Coherence Protocol that restricts the number of simultaneously cached copies of a particular block of data, thus limiting growth of a directory to a constant factor. The Restricted Cache Coherence Protocol can therefore operate as a limited directory protocol. Directory-based coherency holds shared data in a common directory that maintains coherence between caches. The directory operates as a filter in which a processor requests permission to load an entry from primary memory to the corresponding cache. Changing of an entry is addressed by the directory either updating or invalidating the other caches with the corresponding entry. Directory-based systems can have long latencies to address requesting, forwarding, and responding actions, with the benefit of relatively low bandwidth usage since messages are point-to-point and not broadcast. Accordingly, relatively large systems often use directory-based coherency. Restricting the number of simultaneously cached copies of a particular block of data addresses the difficulty of long latencies.

In another example embodiment and/or application, the system can include memory control circuitry 208 supporting a Restricted Cache Coherence Protocol that restricts the size of shared variables worker-sets. In various embodiments, logic in the memory control circuitry can improve performance by limiting size of shared variables worker-sets, restricting memory system functionality to a subset of available functionality, and the like.

A further example system embodiment can include memory control circuitry 208 which supports a Restricted Cache Coherence Protocol that uses a restricted sequential consistency approach. Cache coherency enforces correct memory behavior of a shared-memory system using private caches while verification of cache coherence does not preserve verification of correct memory orderings. Logic in the memory control circuitry 208 can specify when cache coherence is enforced, thus when the results of stores propagate and when taken into account at the receiving memory. The logic can support restricted sequential consistency by maintaining cache coherency at all memory references or by maintaining weak ordering and release consistency in which cache coherency is enforced only at synchronization points.

An additional example system embodiment can include memory control circuitry 208 which supports a Restricted Cache Coherence Protocol that uses restriction of an object to a single thread to maintain consistency. Logic in the memory control circuitry can support routing of shared object management messages between virtual machines and nodes to maintain cache coherence. For example, shared locks and messaging service among nodes and/or virtual machines can improve coherency using a message protocol that can include a hashable object key, a region identifier, and a message type. A thread of an application operates only on objects specified as accessible to the application. At times, one thread of an application accesses an object when another thread also attempts to access the same object. In some situations no conflict arises, such as when multiple threads merely read object contents. However, to address potential conflicts, logic in the memory control circuitry can restrict access to an object to a single thread at one time so that values of the object are not altered by different threads, thereby avoiding the conflict of "dirty writes" to the object. Accordingly, an embodiment of a system that implements a Restricted Cache Coherence Protocol can effectively lock threads from accessing an object in memory that is shared by more than one thread. The lock restricts access to the object to only one thread until the lock is released.

Other example system embodiments can include memory control circuitry 208 which supports a Restricted Cache Coherence Protocol that restricts operations that can be performed by a processor on a block of data. Logic in the memory control circuitry can support maintaining coherency of shared data in cache and memory contained in the nodes of a multiprocessing computer system that includes multiple processors connected to a main memory or distributed. The logic can operate as at least part of a coherence controller in which individual processors in the multiprocessor system are able to send and receive messages out of order to maintain the coherence of the shared data in cache and main memory. For an out of order message causing an incorrect next program state, the coherence controller can restore the prior correct program state and resume execution. The memory control circuitry can be used in a directory based cache and a restricted memory coherence protocol in which messages can be sent and received by individual processors out of order for cache or memory references. Out-of-order messaging enables the protocol to select any of multiple paths between source and destination nodes, improving flexibility and efficiency of a distributed shared-memory computer system. For out-of-order messaging resulting in an incorrect next program state, the system can restore the prior correct program state and continue execution while restricting operations that can be performed by any processor on the block of data to avoid conflicts.

In some embodiments, the system 200 can be configured such that the Restricted Cache Coherence Protocol is a function of at least one processor 202 coupled to the memory bus 210.

In various embodiments, the system 200 can be formed in a manner that the Restricted Cache Coherence Protocol restricts the memory control circuitry 208 to read/write with the co-integrated and co-located memory storage circuitry 208.

Figure 3B:
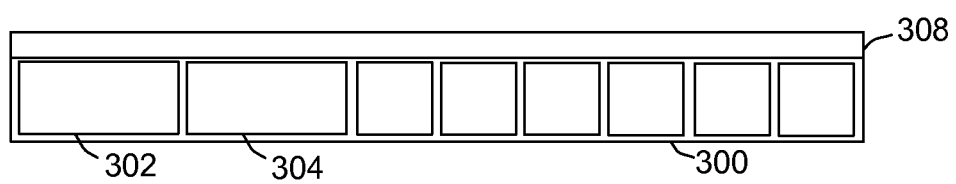

Referring to FIGS. 3A and 3B, respective top and side views of schematic block diagrams show embodiments of a memory device formed with multiple memory portions including at least one characterizing memory portion. In an illustrative embodiment, the memory device 300 can include a characterizing memory portion 302 associated with computational circuitry 308, and a primary memory portion 304. The characterizing memory portion 302 is associated with computational circuitry 308 having a first set of response parameters 310. The primary memory portion 304 has a second set of response parameters 312 that is different from the first set of response parameters 310.

In some embodiments, the memory device 300 can be formed such that the characterizing memory portion 302 includes static random access memory (SRAM).

In various embodiments, the memory device 300 can be constructed with the primary memory portion 302 including dynamic random access memory (DRAM).

Figure 4A:
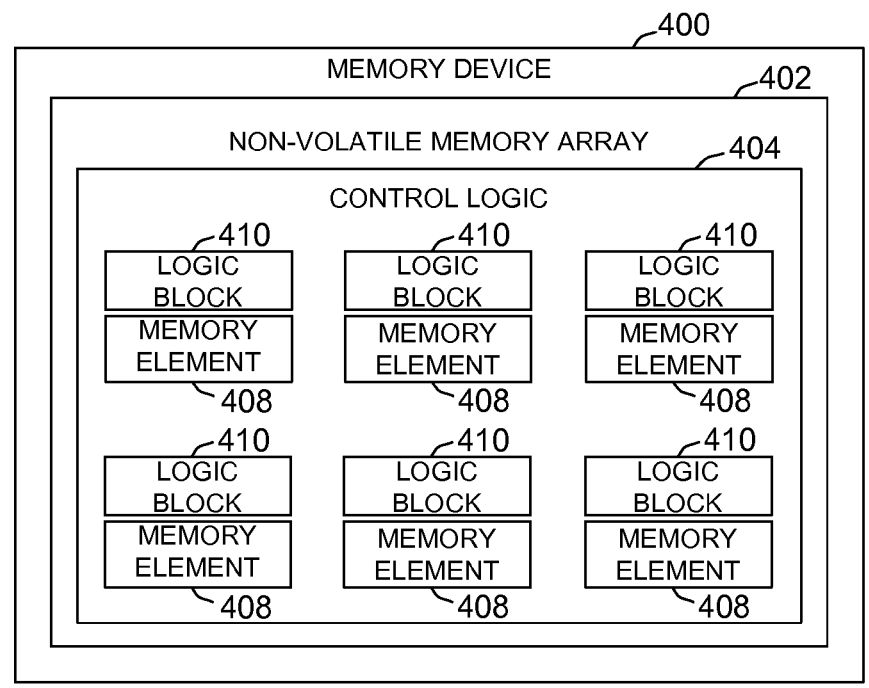
FIGS. 4A and 4B are respective top and side views of schematic block diagrams depict embodiments of a memory device that is operable to perform intelligent memory computation using control logic that is distributed in memory with multiple command logic blocks associated with multiple memory elements.
Figure 4B:
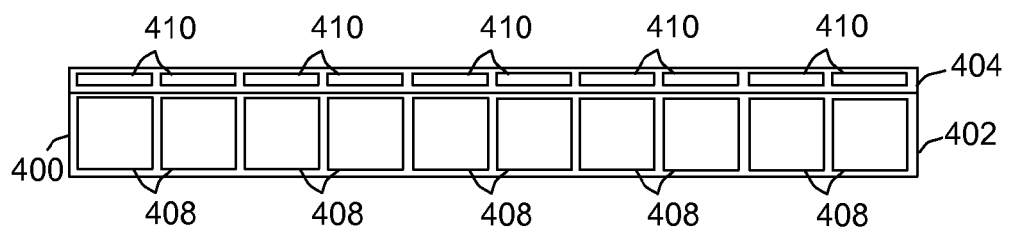

Referring to FIGS. 4A and 4B, respective top and side views of schematic block diagrams depict embodiments of a memory device that is operable to perform intelligent memory computation using control logic that is distributed in memory with multiple command logic blocks associated with multiple memory elements.

In various embodiments and/or applications, the memory device 400 can be configured such that the non-volatile memory array 402 is partitioned into a plurality of memory blocks 408, and the control logic 404 is partitioned into a plurality of command logic blocks 410 which are spatially distributed over the non-volatile memory array 402 in a manner that one or more of the plurality of command logic blocks 410 are associated with one or more of the plurality of memory blocks 408.

In some embodiments, the memory device can be operable to perform intelligent memory computation using control logic that is distributed in memory with multiple memory elements. Various embodiments of the memory device can be adapted to address wear caused by excessive writing. For example, the memory device can be formed with non-volatile that includes a plurality of memory elements. Control logic can be operable to monitor writes to the plurality of memory elements of the non-volatile memory array and allocate writes to the memory elements based on results of the monitoring.

One problem inherent to non-volatile memory is failure that results from multiple writes to a memory element. The control logic can operate to suitably allocate and distribute writes to non-volatile memory cells to avoid or prevent failure, for example by shifting through memory as particular cells are written or by allocating newer or less-written memory to operations, applications, or contexts characterized by a requirement for higher accuracy.

In an example embodiment, the memory device can include control logic can allocate writes according to memory type. For example, the memory device can include a section of PCRAM. Writes can result in substantial wear in PCRAM. When current is injected into a volume of phase-change material, thermal expansion and contraction degrade the electrode storage contact, resulting in programming currents injected into the memory cell that are insufficiently reliable. PCRAM material resistivity is highly dependent on current injection so that current variability leads to resistance variability, degrading the read window of suitable programmed minimum and maximum resistances. Accordingly, the control logic and monitor and determine applications characterized by repeated and enduring writes, and allocate such applications to memory segments other than PCRAM segments.

A memory device can be configured with control logic that is operable to mitigate wear and energy. For example, PCRAM, which is susceptible to wear and failure for high levels of writing to a PCRAM cell over a memory lifetime, can be managed using mitigation techniques of write reduction and leveling to improve PCRAM endurance. In a particular operation, the control logic can allocate some memory to function as a cache and track written cache lines and written cache words to implement partial writes and reduce wear. In another technique, the control logic can monitor writes to eliminate redundant bit writes. In a typical memory access, a write updates an entire row of memory cells, many of which are redundant. The control logic can remove the redundant bit writes and thereby substantially increase memory lifetimes, for example by preceding a write with a read and compare. Following the read, an XNOR gate can be used to filter redundant bit-writes. A PCRAM read is sufficiently faster than a PCM write and writes are less latency critical, so the performance reduction from reading before a write is in consequential.

In addition to eliminating redundant writes, the control logic can also improve write wear performance by row shifting. After removing redundant bit writes, bits most written in a row tend to be localized so that the control logic can perform simple shifting to more evenly distribute writes within a row.

The control logic can attain additional wear improvement by segment swapping in which memory segments of high and low write accesses are periodically swapped. The control logic can track write counts and manage a mapping table between segments.

In another example embodiment, the memory device can include control logic operable to allocate memory according to wear such as by limiting the frequency of allocation for a particular memory block and by maintaining frequently changing metadata in DRAM that is separate from managed blocks of non-volatile memory.

Embodiments of the memory device can perform wear-leveling via managed allocation. For example, the control logic can avoid allocation of a newly released memory block but rather time-stamp the block and add the block to a first-in-first-out queue. On subsequent allocations or releases, the control logic can examine the block at the head of the queue and, if resident on the queue for a sufficient time, can remove the block from the queue and mark eligible for re-allocation. The control logic can maintain list pointers in headers and footers of freed blocks and update the list pointers when adjacent free blocks are merged into a larger free region. In another technique, the control logic can track the allocated or free state of memory blocks using a DRAM bitmap and manage the bitmap dynamically during operations.

In additional embodiments, the memory device can be configured with the non-volatile memory array that includes a plurality of memory elements. Control logic can be operable to monitor writes to the plurality of memory elements of the non-volatile memory array and distribute writes across the memory elements based on results of the monitoring.

In an example arrangement, the memory device can include memory of two types, such as non-volatile RAM (NVRAM) and DRAM in combination with control logic that allocates memory accesses for the NVRAM. The control logic prevents frequent reuse of memory locations and stores frequently-changing metadata in DRAM. The control logic can also add checksums to detect and correct corruption.

In embodiments adapted to promote write durability, the memory device can include a non-volatile memory array with multiple types of memory including at least one portion of memory characterized by elevated write endurance. In a particular embodiment, the non-volatile memory array can include at least on portion formed of M-RAM which is based on a tunneling magneto-resistive (TMR) effect. The individual M-RAM memory cells include a magnetic tunnel junction (MTJ) which can be a metal-insulator-metal structure with ferromagnetic electrodes. A small bias voltage applied between the electrode causes a tunnel current to flow. The MTJ is exposed to an external magnetic field and forms a hysteresis loop with two stable states, corresponding to 0 and 1 data states at zero magnetic field. M-RAM is characterized among non-volatile memory technologies as having excellent write endurance with essentially no significant degradation in magneto-resistance or tunnel junction resistance through millions of write cycles. Accordingly, the control logic can monitor and determine whether a particular application or process is characterized by frequent, enduring write operations and assign a portion of M-RAM to handle memory accesses.

Another memory technology characterized by write endurance is ferroelectric RAM (FeRAM). FeRAM can be constructed using material such as lead-zirconate-titanate (PZT), strontium-bismuth-tantalate (SBT), lanthanum substituted bismuth-tantalate (BLT), and others. An externally applied electric field causes polarization of the FeRAM material to be switched and information retained even upon removal of the field. In absence of the electric field, polarization has two distinct stable states to enable usage in memory storage. FeRAM can have write endurance at the level of M-RAM and is further characterized by a reduced cell size and thus higher density. Thus, the control logic can monitor and determine whether a particular application or process is characterized by frequent, enduring write operations in combination with a relatively large number of storage cells. The control logic can assign a portion of FeRAM to handle memory accesses.

In some applications and/or embodiments, different memory blocks can be allocated for respective different functionality so that the command logic blocks can support functionality that is specific to the appropriate memory blocks.

In additional embodiments and/or applications of the memory device depicted in FIGS. 4A and 4B, the memory device 400 can be adapted for functionality and behavior that differs with memory type. For example, the memory device 400 can be configured such that the non-volatile memory array 402 includes a plurality of memory blocks 408 characterized by a plurality of different operating characteristics. The control logic 404 can be operable to selectively distribute functionality over the plurality of memory blocks 408.

In one or more embodiments of the memory device depicted in FIGS. 4A and 4B, the memory device 400 can have non-volatile memory array 402 which includes a plurality of memory blocks 408 characterized by a plurality of different operating characteristics with control logic 404 that is operable to analyze memory accesses and selectively distribute functionality over the plurality of memory blocks 408 based on the analysis.

In additional operating characteristic-variant embodiments of the memory device depicted in FIGS. 4A and 4B, the memory device 400 can have non-volatile memory array 402 that includes a plurality of memory blocks 408 characterized by a plurality of different operating characteristics. The control logic 404 can be operable to analyze memory accesses, determine application constraints based on the analysis, and selectively distribute functionality over the plurality of memory blocks 408 based on the determined application constraints.

Other embodiments of the memory device depicted in FIGS. 4A and 4B, the memory device 400 can take memory quality of service into consideration. The memory device 400 can have a non-volatile memory array 402 including a plurality of memory blocks 408 characterized by a plurality of different Quality-of-Service (QoS) ratings. The control logic 404 can be operable to analyze memory accesses, determine priority of performance based on the analysis, and selectively distribute functionality over the plurality of memory blocks 408 based on the determined priority of performance. For example, the control logic can allow less-than-perfect performance for suitable applications and/or contexts. The control logic can determine and use QoS ratings for processor in memory (POM), and assign priority of performance to sections of memory. For relatively high performance applications, the device may be configured to work perfectly and the control logic can specify that only highly reliable memory is used. Other applications can operate at a lower QoS and the control logic can select memory accordingly.

The non-volatile memory array can include memory portions formed of memory technologies characterized by high performance under particular operating conditions. Phase change RAM (PCRAM) is a memory technology with highly favorable small cell size and thus density. The memory device which includes at least a portion of PCRAM can further include control logic that monitors and determines operating conditions and can assign memory accesses to PCRAM in low power high performance conditions.

Other examples of non-volatile memory technologies with various QoS ratings can include resistive RAM (R-RAM) and spin-transfer torque RAM (STT-RAM). R-RAM can be any memory technology that relies of resistance change to store information, for example including space-charge-limited-current (SCLC), filament, programmable-metallization-cell (PMC), Schottkey contact and traps (SCT). R-RAM can be characterized by non-volatility, high-speed, high-performance, zero standby power, and, in some arrangements, high density. For a memory device that includes at least a portion of the memory in the form of R-RAM, the control logic can monitor memory accesses and determine whether a particular application is characterized by high-speed and high-performance, and assign the R-RAM memory portion for the application.

In another example application, a memory device can include a non-volatile memory array and includes at least a portion of the memory in the form of STT-RAM. STT-RAM can be characterized by improved performance via overdriving. Overdriving the gate voltage of an NMOS transistor in the STT-RAM can increase $V_{GS}$ and thus enhance the driving strength of the NMOS transistor. The control logic can be configured to manage overdriving, for example, by monitoring memory access operations such as reading, writing, erasing, driving write-line voltage, and the like, and control overdriving according to the particular application.

In some example embodiments of the memory devices depicted in FIGS. 4A and 4B, the non-volatile memory array 402 can include a plurality of memory blocks 408. The control logic 404 can be operable to analyze memory accesses, perform error detection based on the analysis, and characterize Quality-of-Service (QoS) ratings of the plurality of memory blocks 408 based on the performed error detection. For example, the control logic can determine and use QoS ratings, and assign priority of performance to sections of memory. For relatively high performance applications, the device may be configured to work perfectly and the control logic can specify that only highly reliable memory is used. The control logic can perform an error detection operation and determine whether too many errors are occurring according to a predetermined threshold and, if so, the control logic can shift to higher performing memory. The control logic can start an application with a determined QoS rating and monitor errors to iteratively select an appropriate memory segment that is tailored to application characteristics and performance.

In further embodiments of the memory devices depicted in FIGS. 4A and 4B, the memory device 400 can be arranged in which the non-volatile memory array 402 includes a plurality of memory blocks 408. The control logic 404 can be operable to monitor writes to the plurality of memory blocks 408 of the non-volatile memory array 402 and allocate writes to the memory blocks 408 based on results of the monitoring.

In various embodiments of the memory devices depicted in FIGS. 4A and 4B, the memory device 400 can be configured with a non-volatile memory array 402 that includes a plurality of memory blocks 408. The control logic 404 can be operable to monitor operating characteristics of the memory device 400, analyze the monitored operating characteristics, detect a precursor to a memory failure based on the analysis, and allocate memory accesses among the plurality of memory blocks 408 based on the detected precursor.

In further example embodiments of the memory devices depicted in FIGS. 4A and 4B, the memory device 400 can be arranged with non-volatile memory array 402 that includes a plurality of memory blocks 408. The control logic 404 can be operable to receive a report on at least one operating condition of system performance at system bootstrap loading and allocate functionality among the plurality of memory blocks 408 based on the report. An operation at bootstrap loading can cause the system to report on the operating condition of all components (including all chunks of memory) to enable allocation of functionality based on performance of the components.

In a particular application, the memory device can include control logic that restores a persistent application state by mapping non-volatile memory pages across system reboot operations, for example by mapping non-volatile RAM pages in different processes including processes that are not necessarily concurrent. The control logic can also support access control in portions of the non-volatile RAM in the manner of file system access control.

In some applications, what is desired is a capability to store large amounts of data while allowing some amount of inaccuracy or error. Such an application can be video streaming. The memory device can thus be formed with at least a portion of the memory that is very inexpensive but very lossy.

Some types of memory can be susceptible to failure under specified conditions. For example, two-terminal non-volatile memory devices based on resistance switching effects, called memristors, are susceptible to damage from temperature and bias field conditions. Placing a memristor in an oven or applying a bias field can erase the entire memory. A memory device can include a portion of memory which is susceptible to a particular condition and another, redundant portion which is resistant to the condition, thereby enabling operation in a RAID (redundant array of independent disk) array fashion to ensure retention of data during condition episodes. In case of accidental erasure, the control logic can perform functionality analogous to that of a RAID array, for example, to use a slow memory that is impervious to magnetic fields to rebuild the erased data. In a particular embodiment, the slow memory can maintain hash tables are can be heat or magnetic-resistant. A two-way hash can be used to represent data as a hash, thereby reducing memory size.

For a memory device that includes sufficiently large and inexpensive memory, the control logic can perform a copy function at predetermined intervals, for example every 50 cycles or other selected rate, to copy the state to a redundant fast memory for copying to a slow memory, and to facilitate decision-making in memory. Thus, the memory can control sampling with the control logic including sampling functionality, and sampling of fast memory. For applications or contexts such as video handling in which only intermittent frames are sufficient to produce a suitable video image, a backup into lossy memory may be suitable to enable a basic recovery of data. In some embodiments, the memory device may include excess memory in the form of flip-chip via a dedicated bus to send data from a first fast memory to a second fast memory.

The memory device can include control logic that facilitates accessing of memory based on a determination of the type of operations being performed. For example, the control logic can detect high traffic in video streaming and modify data handling to shift from 16-bit byte memory accesses to accessing of blocks of data. For cloud computing applications which are limited by bandwidth, the control logic in the locally-controlled memory device can push all physical parameters off an external processor into the memory device, avoiding the bandwidth limitation and enabling additional memory-local capability including potentially different error correction algorithms. The memory device can thus enable a large scale memory with local control, such as a video memory with frame buffers or a dedicated image memory.

In some applications and/or embodiments, a memory device can incorporate reduced data set redundancy in which a data copy can be compressed in a suitable manner. The control logic can perform redundant data management relatively slowly, avoiding the heat buildup that can result from a fast data transfer. Thus, redundant backup memory buses can be run at comparatively slow speed, thereby avoiding a significant increase in the heat budget for redundancy processing.

The control store can be configured to enable new operations. For example, the control logic can be configured to facilitate efficient memory accesses. In a particular example, the control logic can support a particular type of special image store which stores information of a particular size and form efficiently in memory, that writes different memory elements concurrently to a value that is suitable according to characteristics of the incoming image data. Special instructions can be used that can efficiently perform transforms on the image data.

In various applications and/or embodiments of the memory devices depicted in FIGS. 4A and 4B, the memory device 400 can be configured to perform error detection and/or error correction independently of a processor that is external to the memory device 400. Accordingly, the memory device 400 can be formed such that the non-volatile memory array 402 includes a plurality of memory blocks 408 characterized by a plurality of different operating characteristics. The control logic 404 is operable to perform a plurality of error correction algorithms and selectively allocate ones of the plurality of error correction algorithms to ones of the plurality of memory blocks 408.

In a particular embodiment, the memory device can include the non-volatile memory array which is inexpensive and can be maintained in close proximity to other types of memory either internal to the memory device or in a nearby integrated circuit chip. The control logic can be configured to perform bit-error correction by maintaining multiple copies of data in the high capacity enabled by non-volatile memory arrays, rather than the bit-checks of other error correction techniques. The multiple copies of data in the non-volatile memory can be used to occasionally detect errors using the multiple data copies. Accordingly, the memory device can include a relatively high capacity non-volatile memory array with high capacity and control logic operable to perform error correction. The high capacity in non-volatile memory can be used for error detection and correction in which redundant data is held in the non-volatile memory for error correction in the form of multiple data copies to enable recovery by the receiving memory even when a number of errors up to the capability of the code in use are introduced during transmission or on storage. Errors can be corrected without requesting retransmission by the sender.

In some embodiments of the memory devices depicted in FIGS. 4A and 4B, the memory device 400 can manage memory accesses based on workload. Accordingly, the memory device 400 can have non-volatile memory array 402 which includes a plurality of memory blocks 408. The control logic 404 can be operable to access a time signal and monitor memory accesses referenced by the time signal, analyze workload based on the monitored memory accesses, and allocate memory accesses among the plurality of memory blocks 408 based on the analyzed workload.

For example, the memory device can include control logic that takes into consideration that, at different times, the loads are expected to be different. In a particular instance, the memory device may be used in a data center in which some of the activity is work-related, and other activity is recreational. The control logic can be configured to allocated different types of memory accordingly, for example to handle volumes of streaming video and audio content during non-working hours.

Figure 5A:
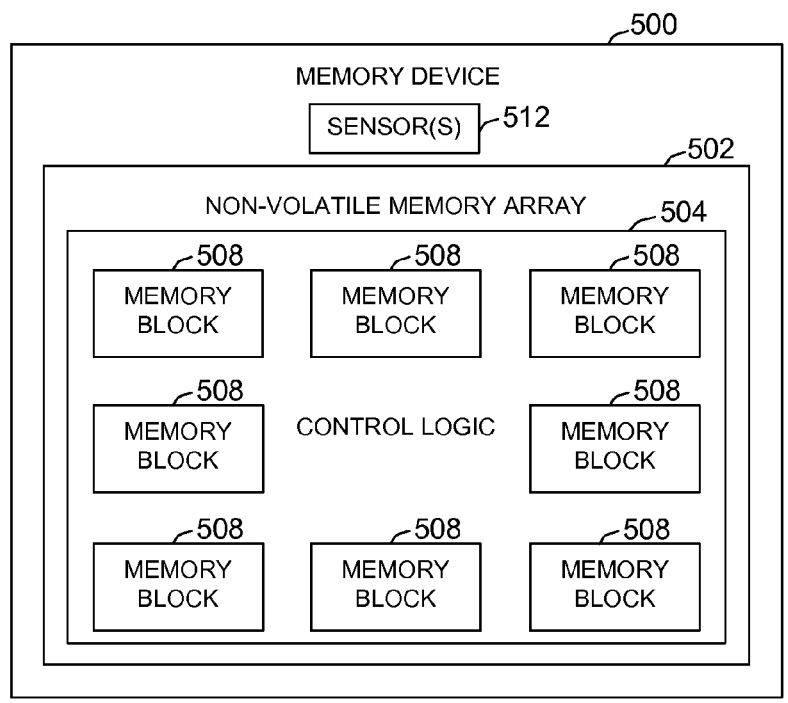
FIGS. 5A and 5B are respective top and side views of schematic block diagrams illustrating embodiments of a memory device that is operable to perform intelligent memory computation using control logic that uses one or more sensors to facilitate management of the memory.
Figure 5B:
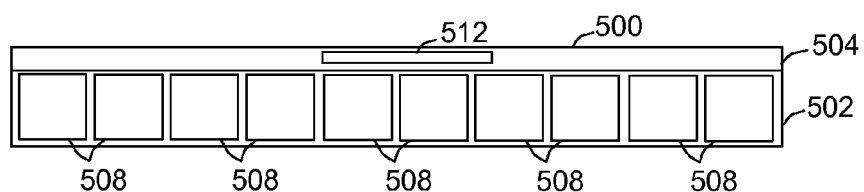
Figure 6A:
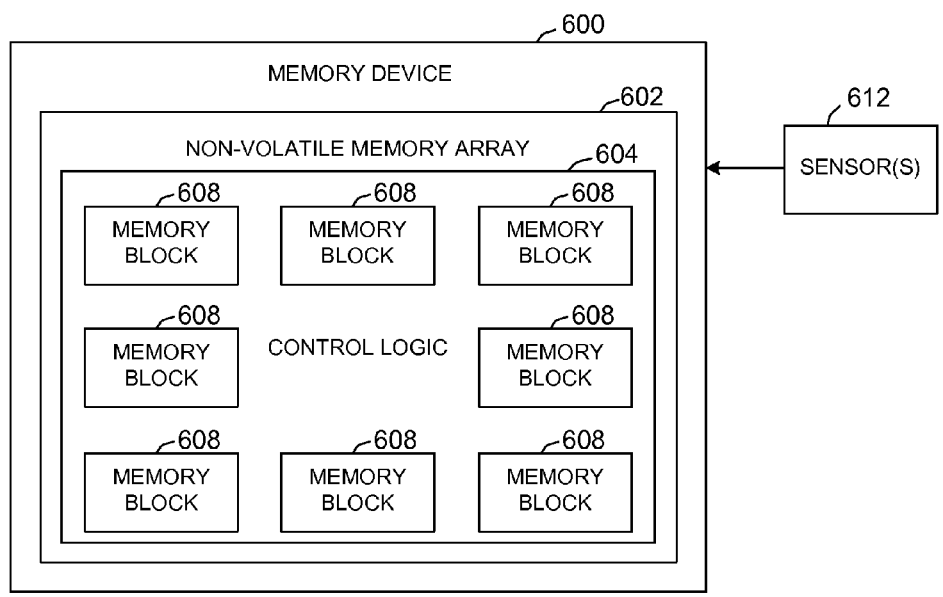
FIGS. 6A and 6B are respective top and side views of schematic block diagrams showing additional embodiments of a memory device that is operable to perform intelligent memory computation using control logic that uses one or more sensors to facilitate management of the memory.
Figure 6B:
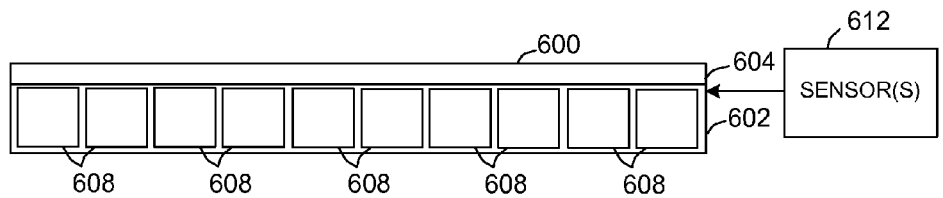

Referring to FIGS. 5A and 5B, respective top and side views of schematic block diagrams illustrate embodiments of a memory device that is operable to perform intelligent memory computation using control logic that uses one or more sensors integrated with the memory device to facilitate management of the memory. FIGS. 6A and 6B, respective top and side views of schematic block diagrams illustrate embodiments of a memory device that is operable to perform intelligent memory computation using control logic that uses one or more sensors external to the memory device to facilitate management of the memory. Various embodiments of the memory device 500, 600 can include one or more sensors to determine who to control or manage storage in memory. In a particular example embodiment, the memory device 500, 600 can further include at least one sensor 512, 612 that is operable to detect an operating condition. The non-volatile memory array 502, 602 can include a plurality of memory blocks 508, 608. The control logic 504, 604 can be operable to monitor the operating condition, analyze the monitored operating condition, detect a precursor to a memory failure based on the analysis, and allocate memory accesses among the plurality of memory blocks 508, 608 based on the detected precursor.

The memory device can include any suitable sensor for detecting a condition that may be useful for allocate memory usage. Example sensors can measure voltage, current, capacitance, resistance, capacitive/resistive, and other electrical or magnetic phenomena. Other suitable sensors can sense touch, tactile phenomena, pressure, vibration, gyro, inertia, angular velocity, and the like. Some sensors can sense ionic, optical, electrochemical, infrared, temperature, and the like.

In an embodiment of a memory device that includes multiple memory types or technologies, the sensor can detect electrical characteristics such as voltage or current and the control logic can determine whether the energy drive is sufficient to drive the memory reliably. If the energy drive is insufficient for a particular type of memory, the control logic can shift memory accesses to a memory type that can be reliably driven.

In other embodiments and/or applications of the memory devices depicted in FIGS. 5A, 5B, 6A, and 6B, the memory device 500, 600 can include at least one sensor 512, 612 operable to detect an operating condition, and the control logic 504, 604 can be used to predict future operations that are appropriate based on the sensed operating condition. The control logic 504, 604 can be operable to monitor the operating condition, monitor memory accesses, analyze the monitored operating conditions and memory accesses, predict expected outcomes based on the monitored operating conditions and memory accesses, and allocate memory accesses based on the predicted expected outcomes.

In a particular application, the memory device can include control logic configured to predict different possible outcomes, for example predicting several possible outcomes and preparing for each, then use sensors, measurements, and monitoring to determine which outcome to activate at a particular time.

In some embodiments and/or applications of the memory devices depicted in FIGS. 5A, 5B, 6A, and 6B, memory accesses can be allocated according to sensed conditions. For example, the memory device 500, 600 can further include at least one sensor 512, 612 operable to detect an operating condition. The non-volatile memory array 502, 602 can include a plurality of memory blocks 508, 608. the control logic 504, 604 can be operable to monitor the operating condition, monitor memory accesses, analyze the monitored operating conditions and memory accesses, predict expected outcomes based on the monitored operating conditions and memory accesses, and allocate memory accesses to the plurality of memory blocks 508, 608 based on the predicted expected outcomes.

Figure 7A:
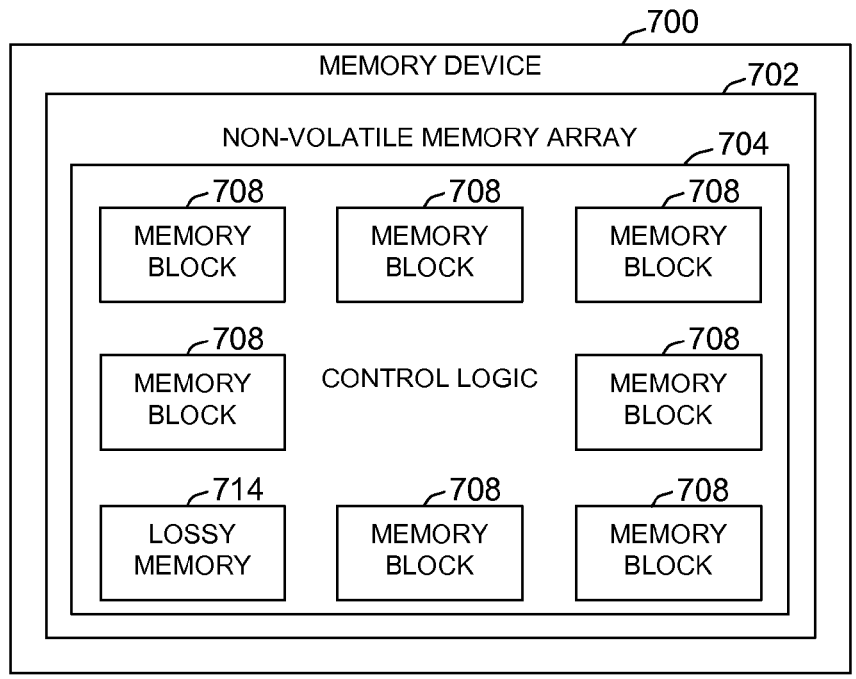
FIGS. 7A and 7B are respective top and side views of schematic block diagrams depicting embodiments of a memory device that is operable to perform intelligent memory computation using control logic that manages memory including at least a portion of the memory in the form of lossy memory.
Figure 7B:
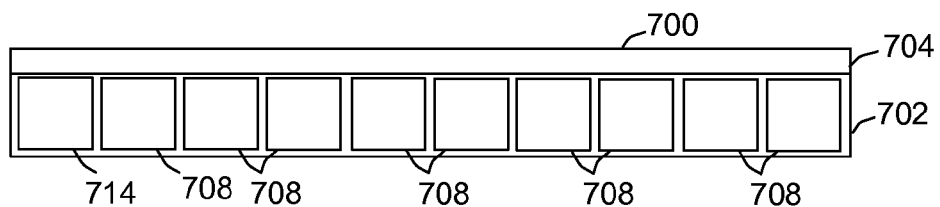

Referring to FIGS. 7A and 7B, respective top and side views of schematic block diagrams illustrate embodiments of a memory device that is operable to perform intelligent memory computation using control logic that manages memory including at least a portion of the memory in the form of lossy memory. In some embodiments and/or applications, the memory device 700 can include relatively inaccurate, inexpensive memory for contexts that allow lower reliability. Accordingly, the memory device 700 can have non-volatile memory array 702 which includes a plurality of memory blocks 708 including at least one memory block including lossy memory 714. The control logic 704 can be operable to monitor memory accesses, analyze the memory accesses to determine instructions and data indicative for storage in the at least one memory block including lossy memory 714, and selectively allocate memory accesses to the at least one memory block including lossy memory 714.

Figure 8A:
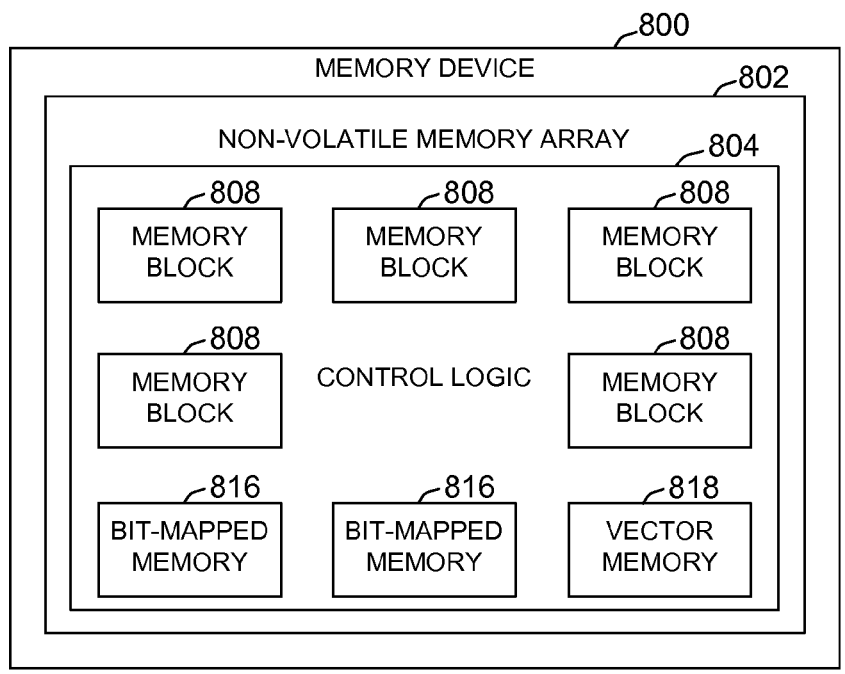
FIGS. 8A and 8B are respective top and side views of schematic block diagrams illustrating embodiments of a memory device that is operable to perform intelligent memory computation using control logic that manages memory including at least a portion of the memory in the form of bitmapped and vector memory.
Figure 8B:
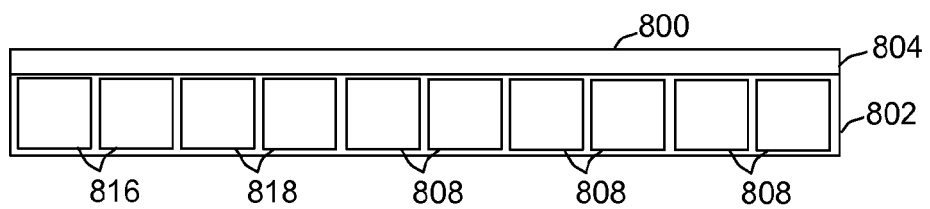

Referring to FIGS. 8A and 8B, respective top and side views of schematic block diagrams illustrate embodiments of a memory device that is operable to perform intelligent memory computation using control logic that manages memory including at least a portion of the memory in the form of bitmapped and vector memory. In various applications and/or embodiments, the memory device 800 can be arranged with non-volatile memory array 802 including a plurality of memory blocks 808. The control logic 804 can be operable to selectively access ones of the plurality of memory blocks 808 as bit-mapped memory 816 and access ones of the plurality of memory blocks 808 as vector memory 818.

For example, in some embodiments or applications a capability for the memory device to efficiently support both bit maps and vector graphics may be useful. Accordingly, the memory device can be configured so that the memory includes a portion that is bit-mapped and a portion that is vector memory. For example, part of the memory can be optimized for pictures and video (JPEG) and another portion optimized for more computational applications. An example of such that context that would benefit from both memory types is a mobile telephone with camera and/or video functionality.

Figure 9A:
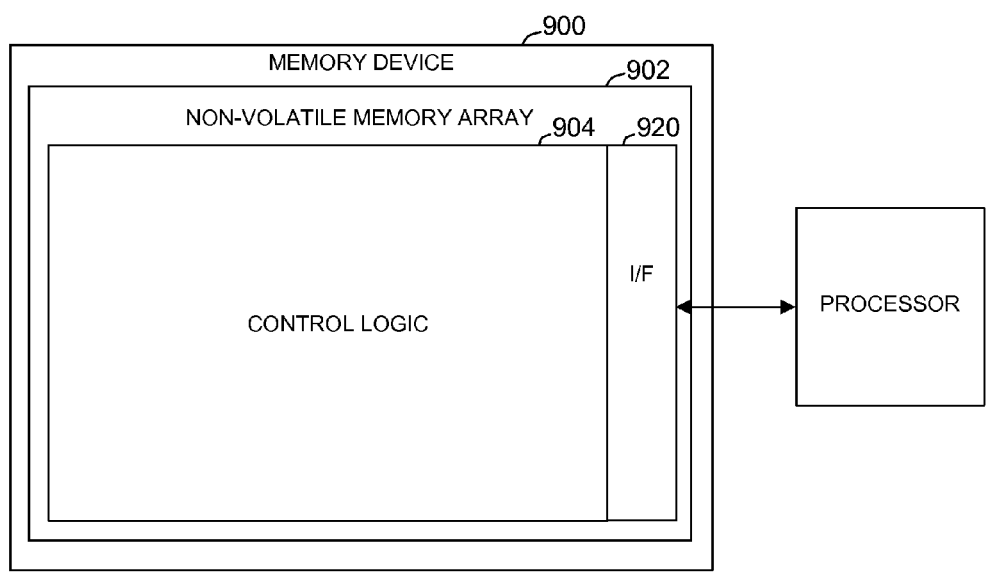
FIGS. 9A and 9B are respective top and side views of schematic block diagrams showing embodiments of a memory device that is operable to perform intelligent memory computation using control logic and includes a communication interface integrated to the control logic and memory.
Figure 9B:
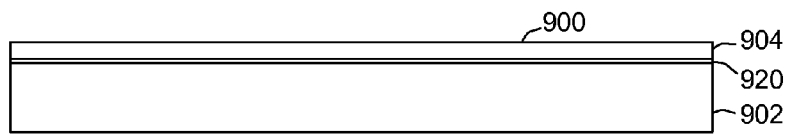

Referring to FIGS. 9A and 9B, respective top and side views of schematic block diagrams illustrate embodiments of a memory device that is operable to perform intelligent memory computation using control logic and includes a communication interface integrated to the control logic and memory. In further embodiments, the memory device 900 can further include a communication interface 920 coupled to the non-volatile memory array 902 and the control logic 904. The communication interface 920 can be operable to communicate external to the memory device 900. A memory device 900 that includes a communication interface 920 can communicate with other such devices or any type of device or system to enable multiple distributed devices to intercommunicate or to communicate with a network, for example in a cloud system. Thus, the memory device 900 can be widely distributed or even ubiquitous, to perform selected local processing regarding usage and environment, for example to enable history tracking, data pre-processing, and sharing to other devices or through the cloud.

In particular example embodiments, the memory device 900 can include a communication interface 920 in which optical silicon is integrated with the non-volatile memory array 902 and the control logic 904 to enable integrated circuits including the memory device 900 to intercommunicate. Usage of optical silicon can enable the memory device to avoid the bandwidth and bottleneck problems of a system bus. The optical silicon can enable data to pass more quickly from outside the memory device to the memory. The memory device can support a WiFi network which optimizes memory for a particular application. Optical silicon can be used to alleviate some of the bandwidth problem for reading high volumes of data, such as for moving photographs from a camera or camera-phone to a storage device such as a computer or library.

Figure 10A:
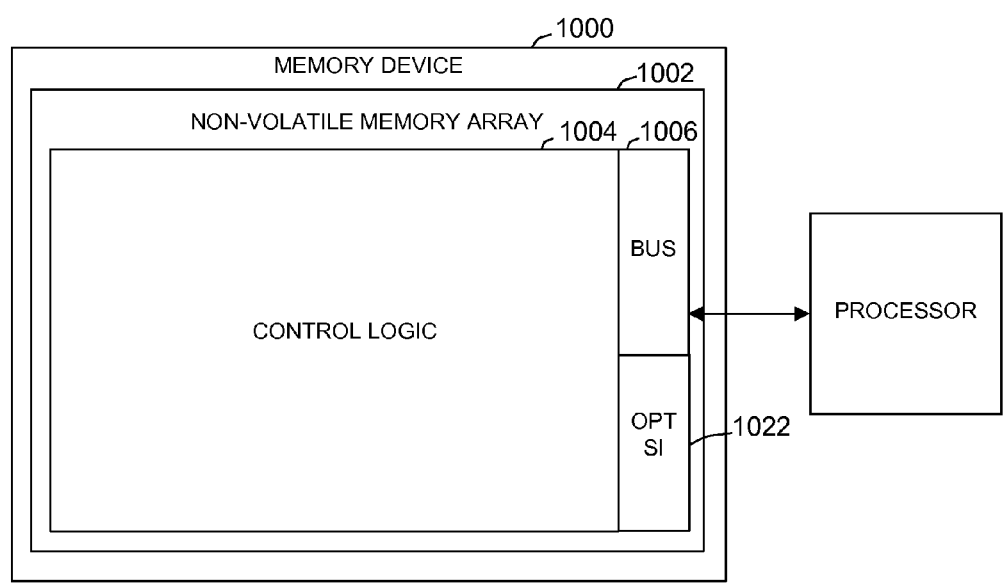
FIGS. 10A and 10B are respective top and side views of schematic block diagrams depicting embodiments of a memory device that is operable to perform intelligent memory computation using control logic and includes a optical silicon integrated to the control logic and memory for communication.
Figure 10B:
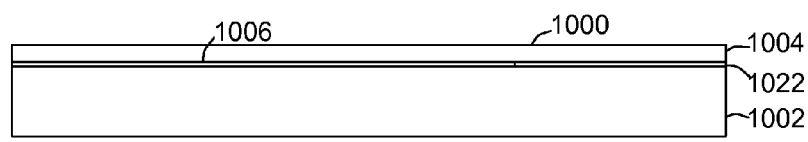

Referring to FIGS. 10A and 10B, respective top and side views of schematic block diagrams illustrate embodiments of a memory device that is operable to perform intelligent memory computation using control logic and includes a optical silicon integrated to the control logic and memory for communication. In a particular embodiment, the memory device 1000 can further include optical silicon 1022 which is operable to communicate optically, independently of a bus 1006 coupled to the memory device 1000 in which the control logic 1004 is operable to receive functions for tracking applications and processes independently of communication via bus 1006. For example, an optical sensor or silicon-based optical data connection can use silicon photonics and a hybrid silicon laser for communication between integrated circuit chips at distributed locations using plasmons (quanta of plasma oscillation) to communicate over relatively long distances, for example 2-3 inches on a narrow nano-wire coupler. The plasmon is a quasiparticle that results from quantization of plasma oscillations. Data can be received and converted using an optical antenna, a nanocavity, or a quantum dot. The communication field can travel independently of a wired bus structure. For example, the memory device 1000 can receive information via the optical link, independently of the system bus connected to a processor, and the control logic 1004 can use the extra-bus information to perform management or housekeeping functions to track applications and/or processes (or, for example, bit correction) via data sent optically to the memory device 1000. The optical link thus enables low-bandwidth, backchannel communication, enabling formation of a memory that can communicate with large bursts of data for placement with optical accessibility.

The memory device can use the optical communication interface to substantially increase bandwidth. For example, dynamic random access memory (DRAM) cannot maintain synchrony over a distance of about four inches so that DRAM must be within four inches or less of a communicating processor, resulting in the memory bus becoming a data choke point, which can be relieved by the optical communication interface. Embodiments of the memory device with an optical interface can use the control logic to perform bus control operations using an optical clock and interferometry using interfering optical beams to accelerate data communication.

In some specific embodiments, the optical silicon interface can be operated by the control logic to increase data communication speed and reliability by constructing signals in the form of a sine-wave in a piece-wise manner, measuring segments above and below a base line and assigning digital values as 0 or 1 depending on wave position. Accordingly, formation of square wave signals is avoided, which attains benefits to heat dissipation, which is proportional to frequency squared.

Figure 11A:
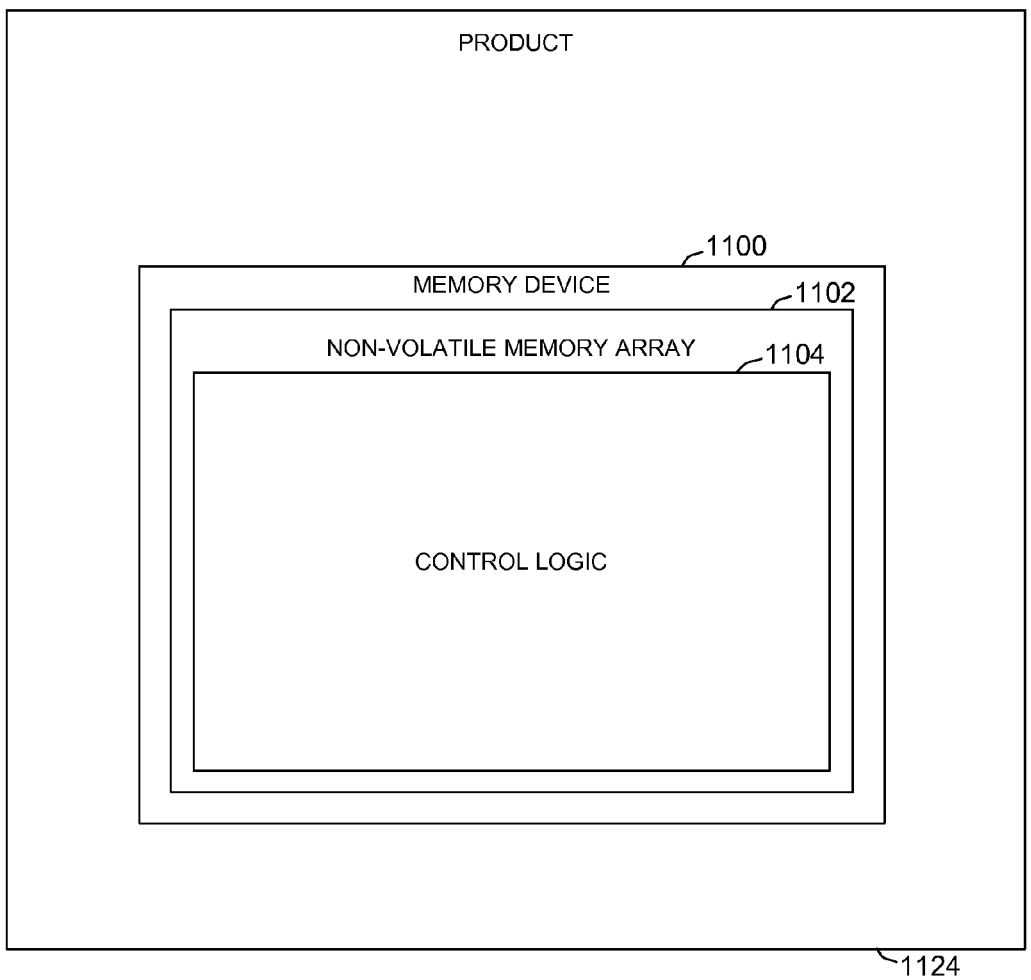
FIGS. 11A and 11B are respective top and side views of schematic block diagrams showing embodiments of a memory device that is operable to perform intelligent memory computation and is integrated into a product.
Figure 11B:
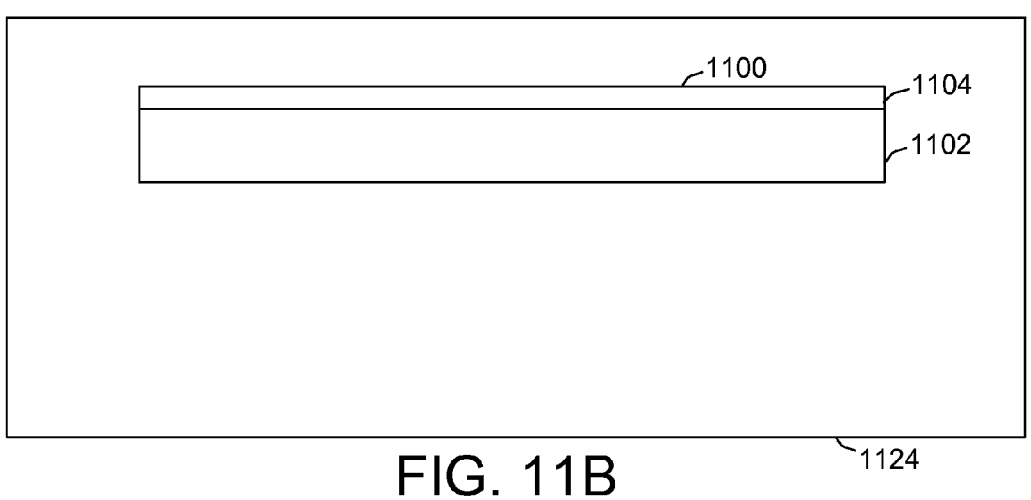

Referring to FIGS. 11A and 11B, respective top and side views of schematic block diagrams show embodiments of a memory device that is operable to perform intelligent memory computation and is integrated into a product. In some applications and/or embodiments, the memory device 1100 can include control logic 1104 that is operable to operate in combination with the non-volatile memory array 1102 to accumulate information about a product 1124. Custom versions of the memory device 1100, which includes processing functionality of the control logic 1104 combined with the non-volatile memory array 1102, can be integrated into any type of product 1124, for example electronic devices, such as mobile and cell phones, notebook computers, personal digital assistants, medical devices, medical diagnostic systems, digital cameras, audio players, digital televisions, automotive and transportation engine control units, USB flash personal discs, and global positioning systems.

In other applications and/or contexts, a memory system can be formed of printed non-volatile memory on polymer. In some arrangements, a printed non-volatile memory on polymer can form flexible memories. For example, a flexible memory can be integrated with processors for further integration into any type of product, even very simple products such as bottles, cans, or packaging materials. A non-volatile memory can be integrated in a system of any suitable product such as, for example, a door handle sleeve to detect and record who, what, when, and how anyone has touched the door handle. Such a system can be used to facilitate access or to provide security. In other examples, a non-volatile memory and processor in some applications with sensors and/or a communication interface can be used in a flexible device for a medical product such as bandages or implants. These products can be formed of dissolvable materials for temporary usage, for example in biocompatible electronic or medical devices that can dissolve in a body environment, or environmental monitors and consumer electronics that can dissolve in compost. Other applications of products incorporating non-volatile memory and processor can include sporting equipment, tags such as for rental cars, patient armbands in hospitals tied to sensors, smart glasses, or any type of device.

In further embodiments, instead of a flexible polymer, the non-volatile memory and processor can be formed of silicon that is sufficiently thin to become flexible and thus formed as an inexpensive printed circuit component. Flexible memory in ubiquitous items, using polymer memory or silicon memory, can enable various profitable services, for example in conjunction with medical devices, security services, automotive products, and the like.

In embodiments of the memory device with processing capability of control logic integrated in a distributed manner with non-volatile memory, the processing capability can be implemented with relatively low speed requirement to enable processors to be available in a ubiquitous manner. Accordingly, information can be acquired in a dispersed manner and intercommunicated over vast systems. Thus processors can be inexpensive and memory readily available for various consumer items. Custom versions of memory including non-volatile memory and RAM can be integrated into virtually any product, enabling widespread preprocessing in items such as door handles to determine who has accessed a location and how the access was made to allow any type of processing on the information.

Figure 12:
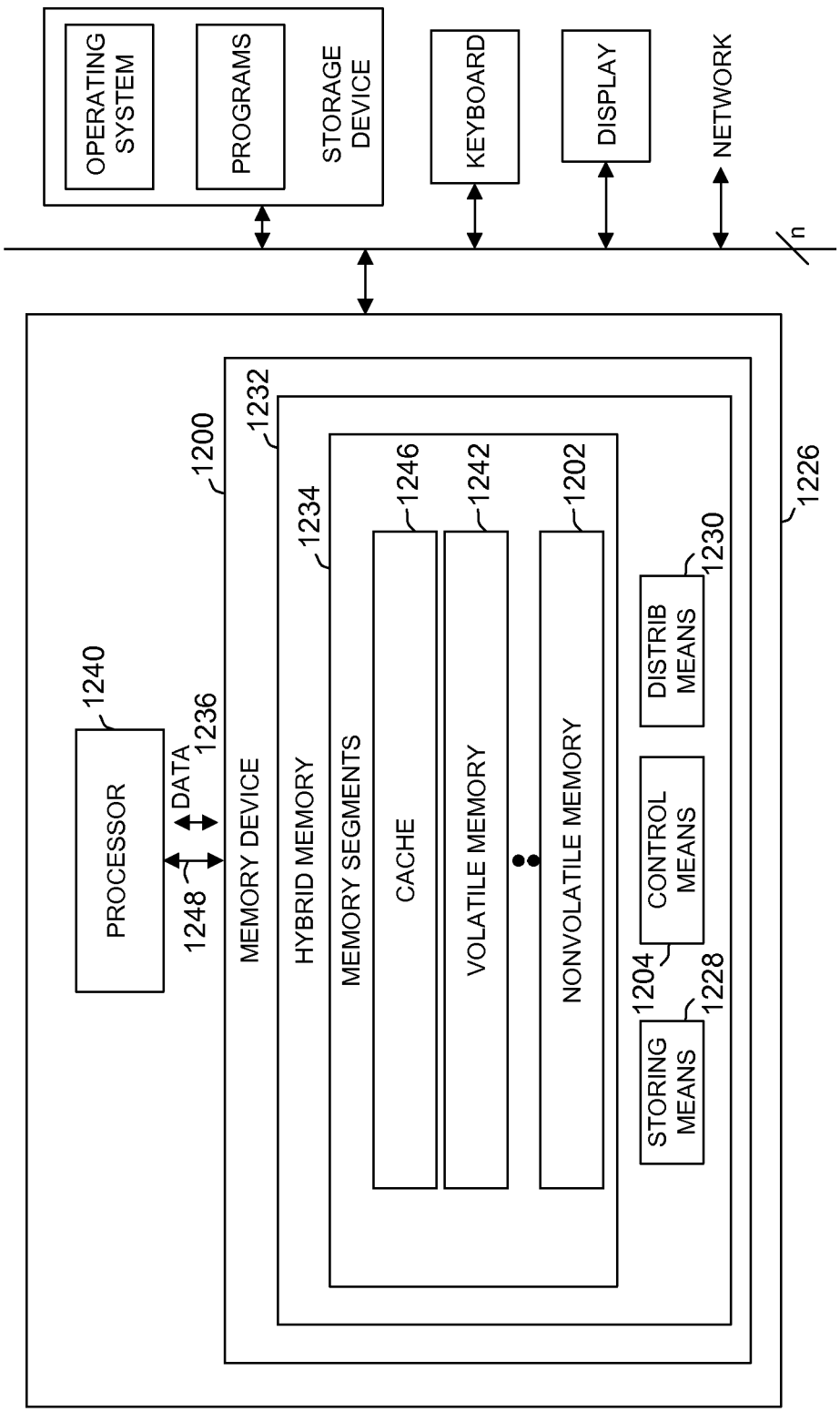
FIG. 12 is a schematic block diagram showing an embodiment of a memory device including means for storing information constituted to facilitate intelligent memory computation using control and/or computation logic integrated into memory.

Referring to FIG. 12, a schematic block diagram shows an embodiment of a memory device including means for storing information constituted to facilitate intelligent memory computation using control and/or computation logic integrated into memory. Accordingly, in further embodiments, as depicted in FIG. 12, a memory system 1226 includes means 1228 for storing information in a memory device 1200 including a non-volatile memory array 1202, means 1204 integrated with and distributed over the non-volatile memory array 1202 for controlling the means for storing information, and means 1230 for selectively distributing functionality across the non-volatile memory array 1202.

In an example embodiment, the memory device 1200 can include a hybrid memory 1232 that includes multiple memory segments 1234 characterized by a multiple different operating characteristics. The hybrid memory 1232 can store data 1236 communicated from a processor 1240. The memory device 1200 can further include logic 1238 for performing encryption operations on the data 1236 during transfers between the memory segments 1234.

In some embodiments, the memory device 1200 can be constituted wherein the logic 1238 operable to perform encryption operations is operable to perform encryption operations on the data 1236 during transfers between the processor 1240 and the multiple memory segments 1234.

The multiple memory segments 1234 can be arranged to include various types of memory with different characteristics and speeds, for example the multiple memory segments 1234 can comprise volatile main memory 1242, non-volatile main memory 1202, or a combination of memory types.

In particular embodiments, the multiple memory segments 1234 can constitute a volatile main memory 1242 and a non-volatile main memory 1202 wherein the volatile main memory 1242 has faster operating characteristics than the non-volatile main memory 1202. For example, the multiple memory segments 1234 can be formed in memory subsystem combining DRAM and a large amount of nonvolatile memory such as flash or phase change memory (PCM).

In some memory device 1200 embodiments, the multiple memory segments 1234 can include a cache 1246. In an example embodiment, DRAM can operate as a cache 1246 for the PCM or nonvolatile memory, facilitating channel encryption between the processor 1240 and the memory device 1200. The logic 1238 operable to perform encryption operations can decrypt the information encrypted by the processor 1240 and sent over the channel and store the decrypted information in the DRAM, then can use storage encryption when passing the information from the DRAM to the PCM or nonvolatile memory 1202.

Various embodiments of the memory device 1200 can be configured for channel encryption. For instance, the logic 1238 operable to perform encryption operations can function to encrypt data 1236 on a communication channel 1248 that communicates information between the processor 1240 and the hybrid memory 1232.

The memory device 1200 can be configured to perform one or more of several channel encryption operations in cooperation with a processor 1240. For instance, the logic 1238 operable to perform encryption operations can operable to decrypt information encrypted by the processor 1240. In some embodiments and/or conditions, the logic 1238 operable to perform encryption operations is operable to decrypt address and data information encrypted by the processor 1240 and store data at the address in the hybrid memory 1232. Similarly, the memory device 1200 can be configured wherein the logic 1238 operable to perform encryption operations is operable to partially decrypt information encrypted by the processor 1240.

Some embodiments of the memory device 1200 can include a random number generator, for example which can be closely associated to and integrated onto the memory device 1200 chip. Accordingly, the control logic 1204 can implement a pseudo-random number generator coupled to the hybrid memory 1232 and coupled to the logic 1238 operable to perform encryption operations. The pseudo-random number generator can be operable to generate numbers for usage in encrypting information.

The memory device 1200 can be configured to implement one or more of a variety of security schemes including channel encryption, storage encryption, RSA (Rivest, Shamir, Adleman) cryptography and key distribution, Public Key Infrastructure (PKI). Accordingly, the logic 1238 operable to perform encryption operations can be operable to perform stream encryption of communicated information wherein processor and memory sides are assigned a key. In another example functionality, the logic 1238 operable to perform encryption operations can be operable to encrypt information that is storage encrypted wherein the storage-encrypted information is encrypted by the processor 1240, stored in the hybrid memory 1232, accessed from the hybrid memory 1232, and decrypted by the processor 1240.

In a particular applications and/or arrangements, the security perimeter can be formed within the memory device 1200 and, for example, enclose the entire memory device 1200, between dynamic random access memory (DRAM) and the memory device 1200, between non-volatile random access memory (RAM) and the memory device 1200, or any other suitable position. The cryptographic and/or tamper-handling perimeter can further be generalized for positioning between a smaller amount of memory and a larger amount of memory in the memory device 1200. Some embodiments can include a cryptographic perimeter in the absence of a tamper-handling perimeter.

In some embodiments, the logic 1238 operable to perform encryption operations can be operable to perform time-varying encryption. For example, channel encryption assisted by the memory device 1200 can enable randomization of encrypted information wherein encrypted data is read back and encryption can be stripped off by the receiving processor 1240. The memory device 1200 with logic or other smart component can enable time-varying encryption. Data can be written to an address which, when read back, is different, but no information is lost since the reading processor 1240 or other reading device at the opposite side of the channel from the smart memory has sufficient intelligence capability to strip off the encryption.

Figure 13A:
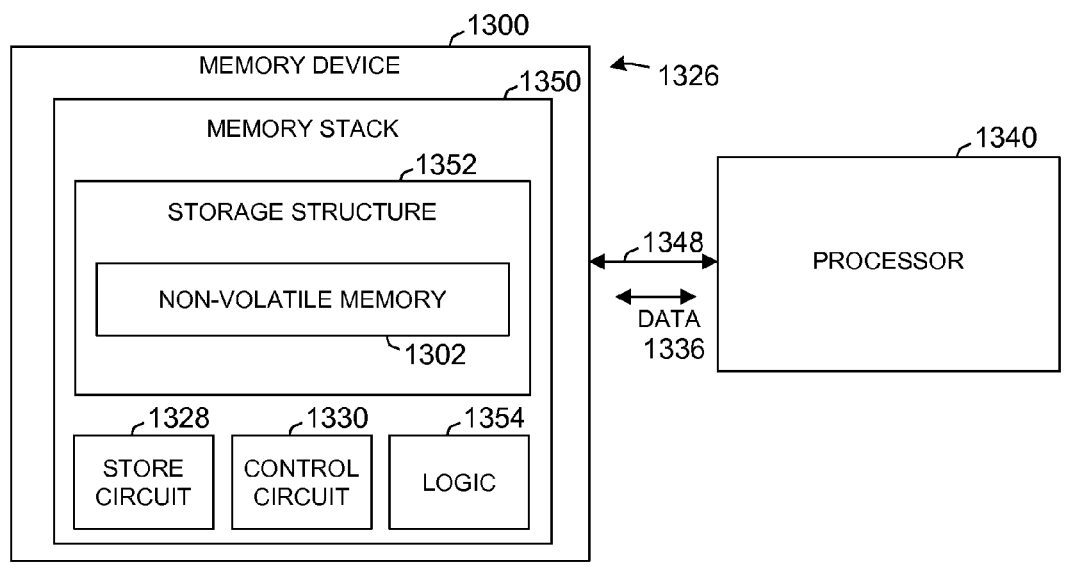
FIGS. 13A and 13B are a schematic block diagram and a side pictorial view illustrating an embodiment of circuitry for storing information to facilitate intelligent memory computation including control and/or computation logic integrated into memory.
Figure 13B:
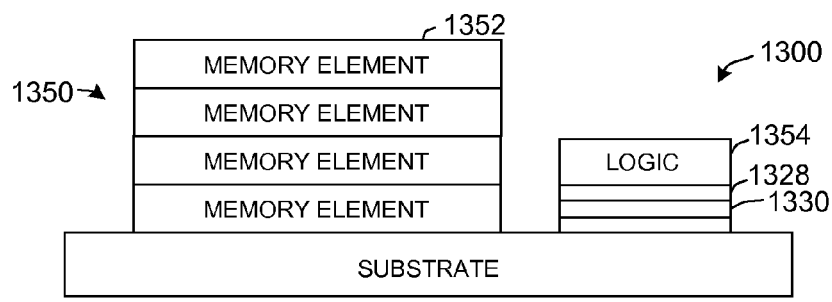

Referring to FIGS. 13A and 13B, a schematic block diagram and a side pictorial view illustrate an embodiment of circuitry for storing information to facilitate intelligent memory computation including control and/or computation logic integrated into memory. In other embodiments and/or applications, a system 1326 can be formed of circuitry. The system 1326 can comprise circuitry 1328 for storing information in a memory device 1300 including a non-volatile memory array 1302, circuitry 1304 integrated with and distributed over the non-volatile memory array 1302 for controlling the circuitry for storing information, and circuitry 1330 for selectively distributing functionality across the non-volatile memory array 1302.

Embodiments of a memory device 1300 that makes use of a memory stack 1350 to facilitate intelligent memory computation. In a particular example embodiment, intelligent memory computation can include security capabilities, including cryptographic security. In an illustrative embodiment, the memory device 1300 can comprise a memory stack 1350 operable to store data 1336 communicated from a processor 1340. The memory stack 1350 can comprise a storage structure 1352 and logic 1354 operable to perform encryption operations. The storage structure 1352 is operable to store data 1336 communicated via a communication channel 1348 from the processor 1340. The logic 1354 is operable to perform encryption operations on the data 1336 during transfers between the processor 1340 and the storage structure 1352.

The memory device 1300 can be constituted to facilitate channel encryption through operation of the logic 1354 operable to perform encryption operations. Accordingly, the logic 1354 operable to perform encryption operations can be operable to perform channel encryption operations on a communication channel 1348 that communicates information between the processor 1340 and the memory stack 1350. Channel encryption can improve performance and economy in various applications and conditions in comparison to expensive storage encryption. The logic 1354 operable to perform encryption operations can facilitate good memory encryption, for example between the processor 1340 and the memory stack 1350. An illustrative configuration can include a CPU that interacts with the memory stack 1350 comprising multiple DRAM chips and the logic 1354 operable to perform encryption operations integrated into a logic chip operable to perform strong channel encryption between the CPU and the memory stack 1350.

In various embodiments, the memory device 1300, the memory stack 1350, and the logic 1354 operable to perform encryption operations can be constituted to perform one or more of several security operations. For example, the logic 1354 operable to perform encryption operations is operable to decrypt information encrypted by the processor 1340. Similarly, the logic 1354 operable to perform encryption operations is operable to partially decrypt information encrypted by the processor 1340. The logic 1354 can also be operable to perform encryption operations is operable to perform stream encryption of information communicated on a communication channel 1348 wherein processor and memory sides of the communication channel 1348 are assigned a key. In an embodiment or circumstances where security can be best attained by using a combination of storage encryption and channel encryption, the logic 1354 operable to perform encryption operations is operable to perform channel encryption operations on a communication channel 1348 for information that is storage encrypted wherein the storage-encrypted information is encrypted by the processor 1340, stored in the memory stack 1350, accessed from the memory stack 1350, and decrypted by the processor 1340. The logic 1354 operable to perform encryption operations can also be operable to perform time-varying encryption.

Information can be stored in the memory stack 1350 unencrypted or the logic 1354 can encrypt the data for storage. Thus, channel encryption can be performed between the CPU and a logic chip, enabling cryptographic security without requiring storage encryption of data stored in the logic chip.

Figures 14A, 14B, 14C:
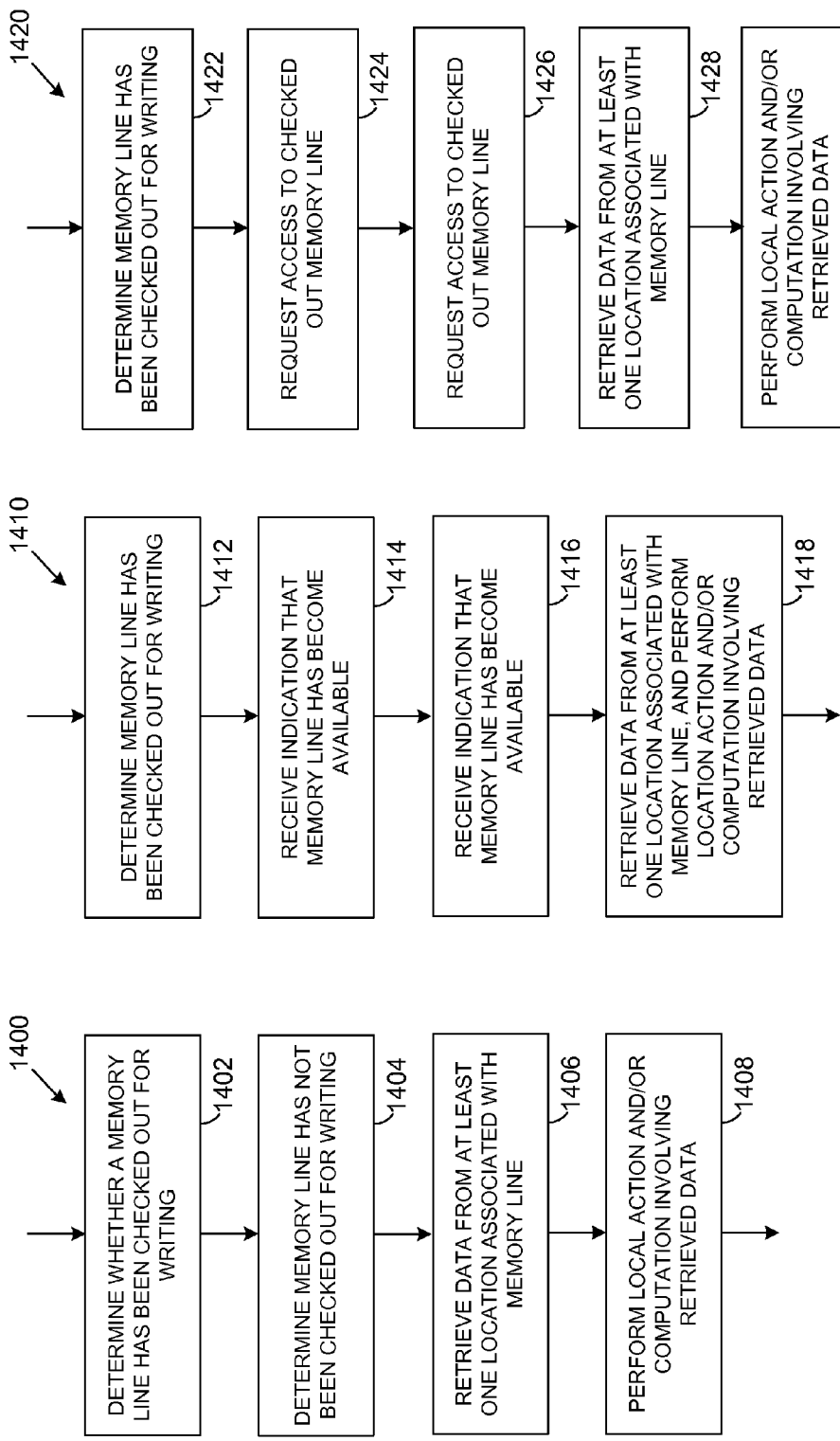
FIGS. 14A through 14C are schematic flow charts illustrating several embodiments and/or aspects of a method for performing local computation.

Referring to FIGS. 14A through 14C, schematic flow charts illustrate several embodiments and/or aspects of a method for performing local computation. The illustrative method 1400, depicted in FIG. 14A, of local computation in a memory device includes locally determining 1402 whether a memory line has been checked out for writing and, upon determining 1404 that the memory line has not been checked out for writing, retrieving 1406 data from at least one location associated with the memory line. The method 1400 can further include performing 1408 a local action and/or computation involving the retrieved data.

Referring to FIG. 14B, in some embodiments, the method 1410 of local computation in the memory device can further include, upon determining 1412 that the memory line has been checked out for writing, receiving 1414 an indication that the memory line has become available. After receiving 1416 an indication that the memory line has become available, the method 1410 can include retrieving 1418 data from at least one location associated with the memory line, and performing a local action and/or computation involving the retrieved data.

In further embodiments and/or applications, as shown in FIG. 14C, the method 1420 of local computation in the memory device can further include, upon determining 1422 that the memory line has been checked out for writing, requesting 1424 access to the checked out memory line. After requesting 1426 access to the checked out memory line, the method 1420 can include retrieving 1428 data from at least one location associated with the memory line; and performing 1430 a local action and/or computation involving the retrieved data.

Referring to FIGS. 15A and 15B, schematic flow charts depict several embodiments and/or aspects of a method for providing data to a memory bus. The illustrative method 1500, depicted in FIG. 15A, of providing data to a memory bus can include retrieving 1502 in a first memory device a first data set, performing 1504 at the first memory device a first local action and/or computation involving the retrieved first data set, and providing 1506 an indication directly to a second memory device coupled to the memory bus of a status of the first local action and/or computation. The method 1500 can further include performing 1508 a second local action and/or computation at the second memory device responsive to the provided indication.

In various embodiments, as depicted in FIG. 15B, the method 1510 of providing data to the memory bus can further include directing 1512 a message to the second memory device of a status of the first local computation, and performing 1514 at the second memory device a second local action and/or computation responsive to the directed message.

Figures 16A, 16B, 16C:
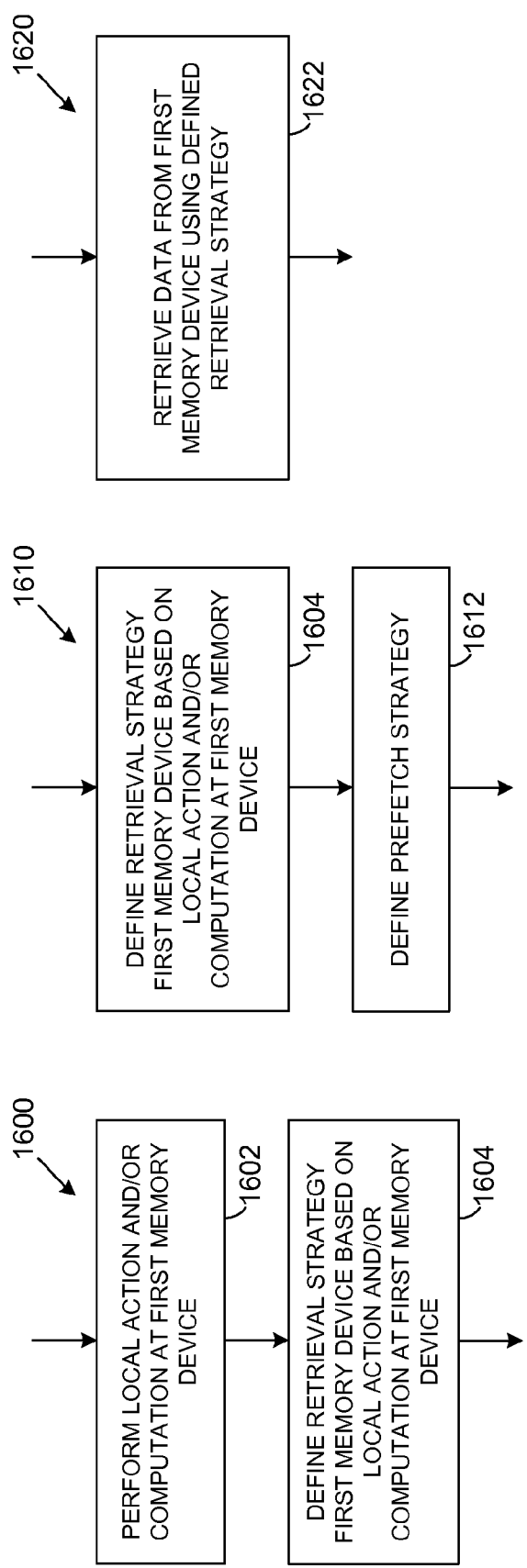
FIGS. 16A through 16G are schematic flow charts showing several embodiments and/or aspects of a method for performing a computation.

Referring to FIGS. 16A through 16G, schematic flow charts show several embodiments and/or aspects of a method for performing a computation. Referring to FIG. 16A, in some embodiments, a method 1600 of performing a computation can include performing 1602 a local action and/or computation at a first memory device, and defining 1604 a retrieval strategy for the first memory device based on the local action and/or computation at a first memory device.

As shown in FIG. 16B, in various embodiments and/or applications, the method 1610 of performing a computation can be configured such that the defining 1604 the retrieval strategy is defining 1612 of a prefetch strategy.

In some embodiments, illustrated in FIG. 16C, the method 1620 of performing a computation can further include retrieving 1622 data from the first memory device using the defined retrieval strategy.

Figures 16D, 16E, 16F, 16G:
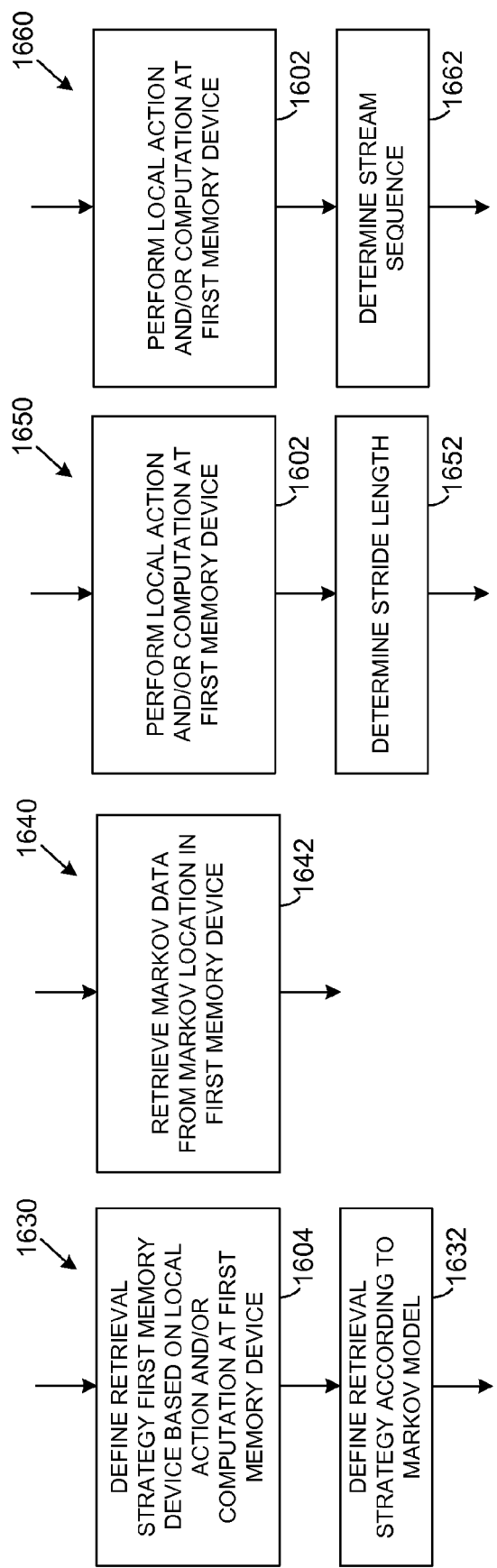

In various embodiments and/or applications, as shown in FIG. 16D, the method 1630 performing a computation can be configured such that defining 1604 a retrieval strategy for the first memory device based on the local action and/or computation at the first memory device includes defining 1632 the retrieval strategy according to a Markov model. The Markov model models the state of a system with a random variable that changes over time. The Markov property specifies that the distribution for the random variable depends only on the distribution of the previous state.

In an example embodiment, the method of performing a computation can define the retrieval strategy using a Markov model in which data to be retrieved can be analyzed according to usage in which records of requests for data are extracted from one or more logs. The records can be grouped, for example by application, requestor, information type, service, and the like and can be sorted by a suitable parameter such as timestamp. A pattern of requests that form an action can be detected with the actions associated with a time. A probability can be calculated of a transition from a precedent action to a subsequent action, in which the precedent action has a time which is prior to the subsequent action. A delay time can be calculated between a precedent action and a subsequent action. A probability can be calculated for a delay time indicative of delay from a precedent action to a subsequent action is within a particular time interval.

In an additional example embodiment, the method of performing a computation can define the retrieval strategy by creating a Markov process that specifies retrieval strategies. Individual retrieval strategies define a data length, and specify items from a set of a specific number of items, and satisfy one or more control constraints specifying one or more requirements on the retrieval strategy. The method can include actions of receiving data defining an initial Markov process of a specific order and having an initial probability distribution and of receiving data defining one or more control constraints. The method can further include the action of generating data defining intermediary matrices, each matrix of a specified dimension, omitting transitions in the initial Markov process data that are disallowed by the control constraints.

In various example embodiments and/or applications, the method of performing a computation can define the retrieval strategy by receiving information defining a relationship between model properties (for example describing term interdependencies and immanence or transcendence) and mathematical basis (such as set theoretic, probabilistic, and algebraic) and extracting mathematical data for a plurality of mathematical bases relating to a plurality of model properties. A Markov chain can be constructed using the mathematical basis data for each of the plurality of model properties, training the Markov chain to learn a set of state parameters using the mathematical basis data, and computing a likelihood of a mathematical basis sequence for each of the plurality of model properties using the trained Markov chains.

Referring to FIG. 16E, selected embodiments of the method 1640 of performing a computation can further include retrieving 1642 Markov data from a Markov location in the first memory device.

As illustrated in FIG. 16F, some embodiments of the method 1650 of performing a computation can be arranged such that performing 1602 a local action and/or computation at the first memory device includes determining 1652 a stride length.

As shown in FIG. 16G, an embodiment of a method 1660 of performing a computation can be formed in a manner that performing 1602 a local action and/or computation at the first memory device includes determining 1662 a stream sequence.

Referring to FIGS. 17A through 17C, schematic flow charts illustrate several embodiments and/or aspects of a method for performing a computation. Referring to FIG. 17A, in some embodiments, a method 1700 of performing a computation can include storing 1702 Markov data in a first location in a first portion of a memory device, retrieving 1704 stored Markov data from the first location, and performing 1706 a local action and/or computation responsive to the retrieved stored Markov data.

In further embodiments and/or applications, as shown in FIG. 17B, the method 1710 of performing a computation can further include retrieving 1712 data from a second portion of the memory device in response to the performed 1706 local action and/or computation.

In various embodiments, as depicted in FIG. 17C, the method 1720 of performing a computation can be configured such that the first portion of the memory device includes 1722 circuitry having a first set of response parameters, and the second portion of the memory device includes 1724 circuitry having a second set of response parameters different from the first set of response parameters.

Referring to FIGS. 18A through 18C, schematic flow charts depict several embodiments and/or aspects of a method for performing a computation. Referring to FIG. 18A, in some embodiments, a method 1800 of performing a computation can include storing 1802 a stride length in a first location in a first portion of a memory device, retrieving 1804 stored stride length from the first location, and performing 1806 a local action and/or computation responsive to the retrieved stored stride length.

As shown in FIG. 18B, in various embodiments and/or applications, the method 1810 of performing a computation can further include retrieving 1812 data from a second portion of the memory device in response to the performed 1806 local action and/or computation.

In some embodiments, illustrated in FIG. 18C, the method 1820 of performing a computation can be arranged in a manner that the first portion of the memory device includes 1822 circuitry having a first set of response parameters, and the second portion of the memory device includes 1824 circuitry having a second set of response parameters different from the first set of response parameters.

Referring to FIGS. 19A through 19C, schematic flow charts show several embodiments and/or aspects of a method for performing a computation. In various embodiments and/or applications, as shown in FIG. 19A, the method 1900 of performing a computation can include storing 1902 a stream sequence in a first location in a first portion of a memory device, retrieving 1904 stored stream sequence from the first location, and performing 1906 a local action and/or computation responsive to the retrieved stored stream sequence.

Referring to FIG. 19B, selected embodiments of the method 1910 of performing a computation further include retrieving 1912 data from a second portion of the memory device in response to the performed 1906 local action and/or computation.

As illustrated in FIG. 19C, some embodiments of the method 1920 of performing a computation can be configured such that the first portion of the memory device includes 1922 circuitry having a first set of response parameters, and the second portion of the memory device includes 1924 circuitry having a second set of response parameters different from the first set of response parameters.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those having ordinary skill in the art will recognize that optical aspects of implementations will typically employ optically-oriented hardware, software, and or firmware.

In some implementations described herein, logic and similar implementations may include software or other control structures suitable to operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described above. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those having ordinary skill in the art will recognize how to obtain, configure, and optimize suitable transmission or computational elements, material supplies, actuators, or other common structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those having ordinary skill in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those having ordinary skill in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those having ordinary skill in the art will recognize that the various embodiments described herein can be implemented, individually and/or collectively, by various types of electro-mechanical systems having a wide range of electrical components such as hardware, software, firmware, and/or virtually any combination thereof and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those having ordinary skill in the art will also appreciate that examples of electro-mechanical systems include but are not limited to a variety of consumer electronics systems, medical devices, as well as other systems such as motorized transport systems, factory automation systems, security systems, and/or communication/computing systems. Those having ordinary skill in the art will recognize that electro-mechanical as used herein is not necessarily limited to a system that has both electrical and mechanical actuation except as context may dictate otherwise.

In a general sense, those having ordinary skill in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those having ordinary skill in the art will recognize that at least a portion of the devices and/or processes described herein can be integrated into an image processing system. Those having skill in the art will recognize that a typical image processing system generally includes one or more of a system unit housing, a video display device, memory such as volatile or non-volatile memory, processors such as microprocessors or digital signal processors, computational entities such as operating systems, drivers, applications programs, one or more interaction devices (e.g., a touch pad, a touch screen, an antenna, etc.), control systems including feedback loops and control motors (e.g., feedback for sensing lens position and/or velocity; control motors for moving/distorting lenses to give desired focuses). An image processing system may be implemented utilizing suitable commercially available components, such as those typically found in digital still systems and/or digital motion systems.

Those having ordinary skill in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems. Those having ordinary skill in the art will recognize that at least a portion of the devices and/or processes described herein can be integrated into a mote system. Those having skill in the art will recognize that a typical mote system generally includes one or more memories such as volatile or non-volatile memories, processors such as microprocessors or digital signal processors, computational entities such as operating systems, user interfaces, drivers, sensors, actuators, applications programs, one or more interaction devices (e.g., an antenna USB ports, acoustic ports, etc.), control systems including feedback loops and control motors (e.g., feedback for sensing or estimating position and/or velocity; control motors for moving and/or adjusting components and/or quantities). A mote system may be implemented utilizing suitable components, such as those found in mote computing/communication systems. Specific examples of such components entail such as Intel Corporation's and/or Crossbow Corporation's mote components and supporting hardware, software, and/or firmware.

Those having ordinary skill in the art will recognize that it is common within the art to implement devices and/or processes and/or systems, and thereafter use engineering and/or other practices to integrate such implemented devices and/or processes and/or systems into more comprehensive devices and/or processes and/or systems. That is, at least a portion of the devices and/or processes and/or systems described herein can be integrated into other devices and/or processes and/or systems via a reasonable amount of experimentation. Those having skill in the art will recognize that examples of such other devices and/or processes and/or systems might include—as appropriate to context and application—all or part of devices and/or processes and/or systems of (a) an air conveyance (e.g., an airplane, rocket, helicopter, etc.), (b) a ground conveyance (e.g., a car, truck, locomotive, tank, armored personnel carrier, etc.), (c) a building (e.g., a home, warehouse, office, etc.), (d) an appliance (e.g., a refrigerator, a washing machine, a dryer, etc.), (e) a communications system (e.g., a networked system, a telephone system, a Voice over IP system, etc.), (f) a business entity (e.g., an Internet Service Provider (ISP) entity such as Comcast Cable, Qwest, Southwestern Bell, etc.), or (g) a wired/wireless services entity (e.g., Sprint, Cingular, Nextel, etc.), etc.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory). A sale of a system or method may likewise occur in a territory even if components of the system or method are located and/or used outside the territory. Further, implementation of at least part of a system for performing a method in one territory does not preclude use of the system in another territory.

One of ordinary skill in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Those having ordinary skill in the art will appreciate that a user may be representative of a human user, a robotic user (e.g., computational entity), and/or substantially any combination thereof (e.g., a user may be assisted by one or more robotic agents) unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components, and/or wirelessly interactable, and/or wirelessly interacting components, and/or logically interacting and/or logically interactable components.

In some instances, one or more components may be referred to herein as "configured to," "configurable to," "operable/operative to," "adapted/adaptable," "able to," "conformable/conformed to," etc. Those having ordinary skill in the art will recognize that "configured to" can generally encompass active-state components and/or inactive-state components and/or standby-state components, unless context requires otherwise. While particular aspects of the present subject matter described herein have been shown and described, it will be apparent to those having ordinary skill in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those having ordinary skill in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms. For example, the phrase "A or B" will be typically understood to include the possibilities of "A" or "B" or "A and B."

With respect to the appended claims, those having ordinary skill in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A computer system comprising:
   primary processing circuitry;
   a bus coupled to the primary processing circuitry; and
   memory circuitry coupled to the bus, the memory circuitry physically separated from the primary processing circuitry, the memory circuitry configured as at least one integrated memory circuit including at least:
      at least one layer of discrete storage cells configured to store and retrieve data and to provide to the bus, during accessing intervals, requested data for the primary processing circuitry, the at least one layer of discrete storage cells distributed over a substrate; and
      computational circuitry distributed over the at least one layer of discrete storage cells distributed over the substrate, the computational circuitry configured for performing supplemental functions at least partially during one or more time periods that are not accessing intervals, the computational circuitry including at least logic distributed over the at least one layer of discrete storage cells configured for concurrently manipulating data in at least two portions of the logic distributed over the at least one layer of discrete storage cells, the concurrently manipulating data in at least two portions of the logic including at least two of:
         a first portion of logic reading and decoding at least one address,
         a second portion of logic fetching data from the at least one address, and
         a third portion of logic performing at least one calculation on the fetched data.

2. The computer system according to claim 1, wherein the computational circuitry configured for performing supplemental functions at least partially during one or more time periods that are not accessing intervals includes:
   computational circuitry configured to present supplementally calculated data in coordination with the requested data.

3. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for searching of data stored in the at least one layer of discrete storage cells.

4. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for sorting of data stored in the at least one layer of discrete storage cells.

5. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for accessing and creating indices for databases stored in the at least one layer of discrete storage cells.

6. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for array computations of data stored in the at least one layer of discrete storage cells.

7. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for least squares computations of data stored in the at least one layer of discrete storage cells.

8. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages for garbage collection of data stored in the at least one layer of discrete storage cells.

9. The computer system according to claim 1, wherein the computational circuitry configured for performing supplemental functions at least partially during one or more time periods that are not accessing intervals includes:
   computational circuitry including at least logic distributed over the at least one layer of discrete storage cells configured for performing atomic operations in multiple-stages including at least one of maximum, minimum, or equality computations of data stored in the at least one layer of discrete storage cells.

10. The computer system according to claim 1, wherein the computational circuitry configured for performing supplemental functions at least partially during one or more time periods that are not accessing intervals includes:
    computational circuitry including at least logic distributed over the at least one layer of discrete storage cells configured for performing atomic operations in multiple-stages for statistical computations of data stored in the at least one layer of discrete storage cells.

11. The computer system according to claim 1, wherein the computational circuitry configured for performing supplemental functions at least partially during one or more time periods that are not accessing intervals includes:
    computational circuitry including at least logic distributed over the at least one layer of discrete storage cells configured for performing one or more atomic operations on data stored in the at least one layer of discrete storage cells, wherein at least one of the one or more atomic operations is selected to reduce or minimize number of silicon layers in the at least one integrated memory circuit.

12. The computer system according to claim 1, wherein the computational circuitry configured for performing supplemental functions at least partially during one or more time periods that are not accessing intervals includes:

computational circuitry including at least logic distributed over the at least one layer of discrete storage cells configured for performing one or more atomic operations on data stored in the at least one layer of discrete storage cells, wherein at least one of the one or more atomic operations is selected to reduce or minimize power requirements in the at least one integrated memory circuit.

13. The computer system according to claim 1, wherein the computational circuitry configured for performing supplemental functions at least partially during one or more time periods that are not accessing intervals includes:
computational circuitry including at least logic distributed over the at least one layer of discrete storage cells configured for performing one or more atomic operations on data stored in the at least one layer of discrete storage cells, wherein at least one of the one or more atomic operations is selected to reduce or minimize heat dissipation in the at least one integrated memory circuit.

14. The computer system according to claim 1, wherein the computational circuitry configured for performing supplemental functions at least partially during one or more time periods that are not accessing intervals includes:
computational circuitry including at least logic distributed over the at least one layer of discrete storage cells configured for performing one or more atomic operations on data stored in the at least one layer of discrete storage cells, wherein at least one of the one or more atomic operations is selected to reduce or minimize number of metal layers in the at least one integrated memory circuit.

15. The computer system according to claim 1, wherein the computational circuitry configured for performing supplemental functions at least partially during one or more time periods that are not accessing intervals includes:
computational circuitry including at least logic distributed laterally across the at least one layer of discrete storage cells, wherein at the lateral distribution across the at least one layer of discrete storage cells is configured for at least one of (1) reducing or minimizing number of silicon layers in the at least one integrated memory circuit, (2) reducing or minimizing power requirements in the at least one integrated memory circuit, (3) reducing or minimizing heat dissipation in the at least one integrated memory circuit, or (4) reducing or minimizing number of metal layers in the at least one integrated memory circuit.

16. The computer system according to claim 1, wherein the computational circuitry configured for performing supplemental functions at least partially during one or more time periods that are not accessing intervals includes:
computational circuitry including at least logic distributed over the at least one layer of discrete storage cells configured for monitoring memory accesses, detecting a pattern of instructions and data from the monitored memory accesses, predicting expected instructions and data from the detected pattern of instructions and data, and preprocessing the predicted expected instructions.

17. The computer system according to claim 1, wherein the computational circuitry configured for performing supplemental functions at least partially during one or more time periods that are not accessing intervals includes:
computational circuitry including at least logic distributed over the at least one layer of discrete storage cells configured for performing a Restricted Cache Coherence Protocol.

18. The computer system according to claim 1, wherein the computational circuitry configured for performing supplemental functions at least partially during one or more time periods that are not accessing intervals includes:
computational circuitry including at least logic distributed over the at least one layer of discrete storage cells configured for locally determining whether a memory line has been checked out for writing, upon determining that the memory line has not been checked out for writing retrieving data from at least one location associated with the memory line, and performing a local action and/or computation involving the retrieved data.

19. The computer system according to claim 1, wherein the computational circuitry configured for performing supplemental functions at least partially during one or more time periods that are not accessing intervals includes:
computational circuitry including at least logic distributed over the at least one layer of discrete storage cells configured for performing at least one of an action or computation, and defining a retrieval strategy based on the at least one of an action or computation.

20. The computer system according to claim 1, wherein the computational circuitry configured for performing supplemental functions at least partially during one or more time periods that are not accessing intervals includes:
computational circuitry including at least logic distributed over the at least one layer of discrete storage cells configured for monitoring memory accesses and performing pattern recognition on the monitored memory accesses.

21. The computer system according to claim 1, wherein the computational circuitry configured for performing supplemental functions at least partially during one or more time periods that are not accessing intervals includes:
computational circuitry including at least logic distributed over the at least one layer of discrete storage cells configured for monitoring memory accesses, determining statistics on type and number of instructions of the monitored memory accesses, and predicting a sequence of instructions and data using the determined statistics.

22. A memory device operable to store data for primary processing circuitry via a bus, the memory device comprising:
memory circuitry configured as at least one integrated memory circuit including at least:
at least one layer of discrete storage cells configured to store and retrieve data and to provide to a bus, during accessing intervals, requested data for primary processing circuitry, the at least one layer of discrete storage cells distributed over a substrate; and
computational circuitry distributed over the at least one layer of discrete storage cells distributed over the substrate, the computational circuitry configured for performing supplemental functions at least partially during one or more time periods that are not accessing intervals, the computational circuitry including at least logic distributed over the at least one layer of discrete storage cells configured for concurrently manipulating data in at least two portions of the logic distributed over the at least one layer of discrete storage cells, the concurrently manipulating data in at least two portions of the logic including at least two of:
a first portion of logic reading and decoding at least one address,
a second portion of logic fetching data from the at least one address, and
a third portion of logic performing at least one calculation on the fetched data.

* * * * *